United States Patent [19]
Nishimoto et al.

[11] Patent Number: 5,814,543
[45] Date of Patent: Sep. 29, 1998

[54] METHOD OF MANUFACTURING A SEMICONDUTOR INTEGRATED CIRCUIT DEVICE HAVING NONVOLATILE MEMORY CELLS

[75] Inventors: Toshiaki Nishimoto, Tachikawa; Shoji Shukuri, Koganei; Tsutomu Okazaki, Ome; Hideo Tobe, Kokubunji; Kazuhiro Komori, Musashimurayama; Masataka Kato, Koganei; Hitoshi Kume, Musashino, all of Japan

[73] Assignee: Hitachi, Ltd., Tokyo, Japan

[21] Appl. No.: 562,021

[22] Filed: Nov. 22, 1995

[30] Foreign Application Priority Data

Nov. 22, 1994 [JP] Japan .................................. 6-287813
Jun. 15, 1995 [JP] Japan .................................. 7-148467

[51] Int. Cl.[6] ............................................. H01L 21/8247
[52] U.S. Cl. ......................... 438/264; 438/265; 438/592
[58] Field of Search ............................ 437/43, 52, 977; 438/257, 262, 263, 264, 592, 265

[56] References Cited

U.S. PATENT DOCUMENTS

| | | |
|---|---|---|
| 4,354,309 | 10/1982 | Gardiner et al. . |
| 4,789,883 | 12/1988 | Cox et al. . |
| 5,079,603 | 1/1992 | Komori et al. . |
| 5,087,583 | 2/1992 | Hazani ........................................ 437/43 |
| 5,300,802 | 4/1994 | Komori et al. . |
| 5,352,619 | 10/1994 | Hong ........................................ 437/43 |
| 5,427,970 | 6/1995 | Hsue et al. ................................. 437/43 |
| 5,453,391 | 9/1995 | Yiu et al. .................................... 437/43 |
| 5,491,104 | 2/1996 | Lee et al. .................................... 437/52 |

FOREIGN PATENT DOCUMENTS 6-177392  6/1994  Japan .

OTHER PUBLICATIONS

H. Kume et al., "A 1.28 m[2] Contactless Memory Cell Technology for a 3V–Only 64Mbit EEPROM", Hitachi, Ltd, 1992.

B. Woo, et al., "A Poly–Buffered FACE Technology for High Density Flash Memories", Symp. on VLSI Tech. Dig. pp. 73–74, 1991.

*Primary Examiner*—John Niebling
*Assistant Examiner*—Richard A. Booth
*Attorney, Agent, or Firm*—Antonell, Terry, Stout & Kraus, LLP

[57] ABSTRACT

A method for fabricating a semiconductor integrated circuit device comprising a nonvolatile memory cell, comprises the steps of forming a first gate material which comprises a silicon film containing no impurities, whose top surface is covered with an oxidation-resistant mask, and whose width in the gate-length direction is prescribed, on part of the surface of a first gate insulating film, forming a thermal-oxidation insulating film on the surface of an active region of a semiconductor substrate through thermal oxidation, removing an oxidation-resistant mask, forming a second gate material which comprises a silicon film into which impurities are introduced and whose width in the gate-length direction is prescribed, on each surface of the thermal-oxidation insulating film and the first gate material forming a second gate insulating film on the surface of the second gate material, and forming a third gate material on the surface of the second gate insulating film.

19 Claims, 19 Drawing Sheets

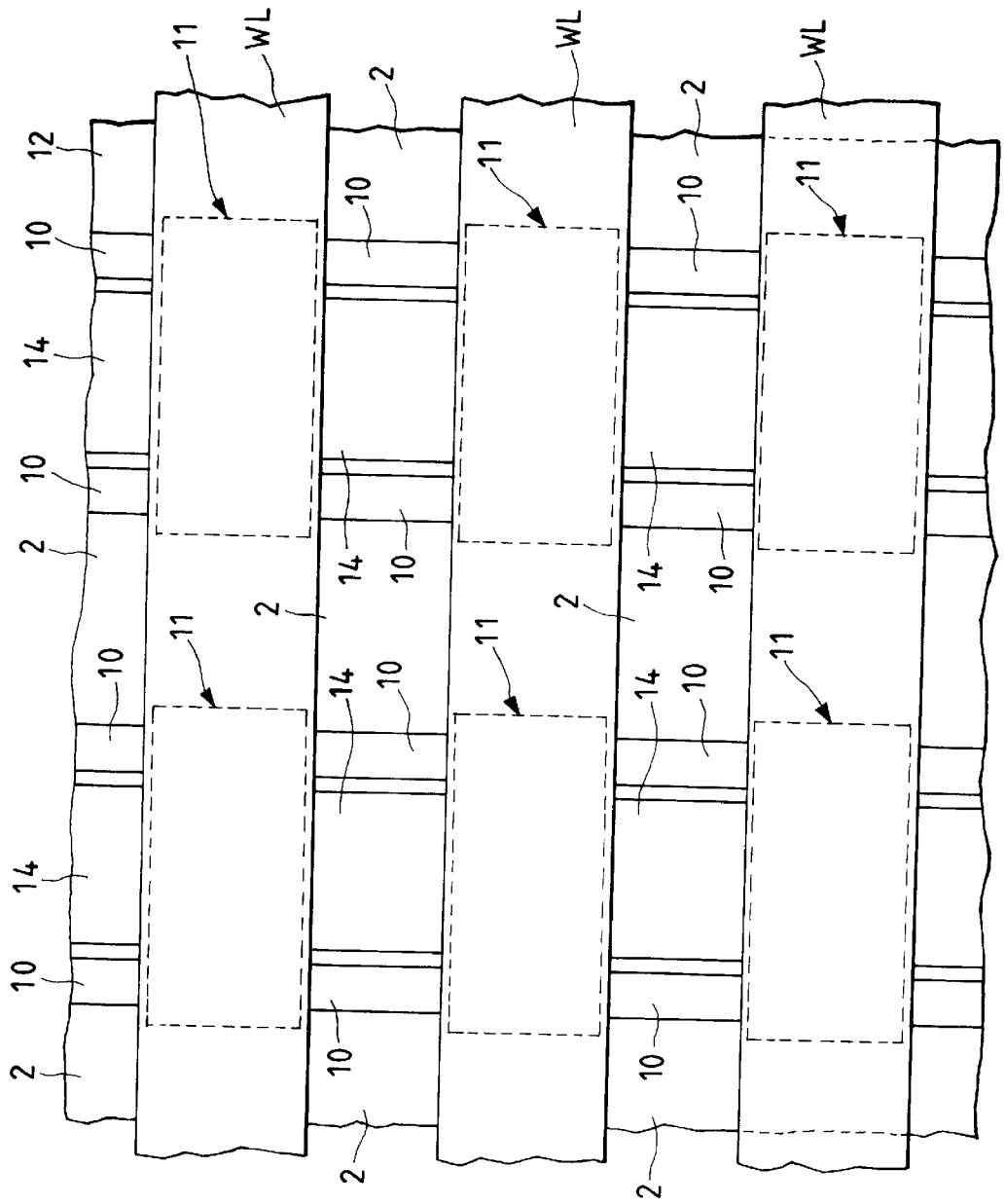

METHOD OF MANUFACTURING A SEMICONDUTOR INTEGRATED CIRCUIT DEVICE HAVING NONVOLATILE MEMORY CELLS

BACKGROUND OF THE INVENTION

The present invention relates to a semiconductor integrated circuit device, and particularly, to a semiconductor integrated circuit device comprising a nonvolatile memory cell in which a charge storage gate electrode (floating gate electrode) is formed on the surface of an active region through a first gate insulating film and a control gate electrode is formed on the surface of the charge storage gate electrode through a second gate insulating film.

A semiconductor integrated circuit device called a NOR-type flash memory is disclosed in, for example, U.S. Pat. No. 5,079,603 and U.S. Pat. No. 5,300,802 as a semiconductor integrated circuit device comprising a nonvolatile memory cell. The NOR-type flash memory has a structure in which a plurality of nonvolatile memory cells are arranged like a matrix and data written in these nonvolatile memory cells can be electrically erased simultaneously.

The nonvolatile memory cell is formed on the surface of an active region of a semiconductor substrate. The nonvolatile memory cell mainly comprises a semiconductor substrate used as a channel forming region, a first gate insulating film, a charge storage gate electrode, a second gate insulating film, a control gate electrode, and a pair of semiconductor regions serving as a source region and a drain region respectively. The nonvolatile memory cell is provided at an intersection of a word line extending in the X direction (gate-length direction) and a data line extending in the Y direction (gate-width direction). The word line is made of a polycrystalline silicon film and is integrally formed with the control gate electrode of each of a plurality of nonvolatile memory cells arranged in the word-line extending direction. The data line is made of a metallic film formed above the word line and is electrically connected to each of semiconductor regions (drain regions) of a plurality of nonvolatile memory cells arranged in the data line extending direction.

SUMMARY OF THE INVENTION

As a semiconductor integrated circuit device comprising a nonvolatile memory cell, a known semiconductor integrated circuit device for performing both programming and erasing operations for the nonvolatile memory cell in accordance with the tunnel effect is disclosed in Japanese Patent Laid-Open No. 177392/1994 which was laid open on Jun. 24, 1994 or described in IEDM (International Electron Device Meeting) Technical Digest, pp. 991–993, 1992. The erasing operation of the nonvolatile memory cell mounted on the semiconductor integrated circuit device is performed by injecting charges into a charge storage gate electrode from a channel forming region (semiconductor substrate) between the source and drain regions in accordance with the tunnel effect and the programming operation of the nonvolatile memory cell is performed by discharging the charges stored in the charge storage gate electrode to the drain region by the tunnel effect. A method for fabricating such a semiconductor integrated circuit device which performs programming and erasing operations for a nonvolatile memory cell by the tunnel effect will be described below.

A thermal-oxidation insulating film (field insulating film) is first formed on the surface of an inactive region of a p-type semiconductor substrate and, thereafter, a first gate insulating film is formed on the surface of the active region of the p-type semiconductor substrate.

Then, a first gate material is formed on part of the surface of the first gate insulating film, which is made of a polycrystalline silicon film containing impurities, whose top surface is covered with an oxidation-resistant mask, and whose width in the gate-length direction (X direction) is prescribed. The oxidation-resistant mask and the first gate material extend in the gate-width direction (X direction).

Then, n-type impurities are introduced into the surface of the active region of the p-type semiconductor substrate in self-aligningment with the thermal-oxidation insulating film and oxidation-resistant mask to form a pair of n-type semiconductor regions serving as a source region and a drain region, respectively. Each of the two n-type semiconductor regions extends in the gate-width direction (Y direction) and connects with each of a pair of n-type semiconductor regions serving as source and drain regions of a plurality of nonvolatile memory cells arranged in the gate-width direction. One of the n-type semiconductor regions is used as a data line.

Then, a pair of thermal-oxidation insulating films are formed through thermal oxidation on the surface of the active region of the p-type semiconductor substrate between the thermal-oxidation insulating film and the first gate material. Each of the two thermal-oxidation insulating films extends in the gate-width direction to cover the surface of each of the two n-type semiconductor regions serving as a source region and a drain region, respectively.

Then, the oxidation-resistant mask is removed. Thereafter, a second gate insulating film is formed on the surface of the first gate material and moreover, a second gate material is formed on the surface of the second gate insulating film.

Then, patterning for prescribing the width in the gate-width direction is applied to the second gate material and patterning for prescribing the width in the gate-width direction is applied to the first gate material in order to form a control gate electrode with the second gate material and a charge storage gate electrode with the first gate material. A nonvolatile memory cell is completed through the above process.

The present inventors have found the following problems in nonvolatile memory cells which are fabricated in a way that the first gate material is formed and thereafter, a thermal-oxidation insulating film is formed through thermal oxidation.

(1) In a semiconductor integrated circuit device comprising a nonvolatile memory cell, when a first gate material is formed and, thereafter, a thermal-oxidation insulating film (field insulating film) is formed through thermal oxidation on the surfaces of active and inactive regions of a semiconductor substrate, a thermal-oxidation insulating film grows on each side of the first gate material in the gate length direction. Though the growth rate of the thermal-oxidation insulating film depends on the film quality of the first gate material, it is accelerated by impurities introduced into the first gate material. For example, when a polycrystalline silicon film is used for the first gate material, the oxidation rate of the thermal-oxidation insulating film is lower than that of a single-crystal silicon film but higher than that of an amorphous silicon film (a-Si). When a polycrystalline silicon film (doped polysilicon film) with an impurity concentration of $1 \times 10^{20}$ atoms/cm$^3$ or higher is used for the first gate material, the growth rate of the thermal-oxidation insulating film is lower than that of a polycrystalline silicon film (non-doped polysilicon film) with an impurity concentration of $1 \times 10^{19}$ atoms/cm$^3$ or higher. That is, because the thermal-oxidation insulating film grows at a high speed in the gate-length direction on each gate-length-directional side of the first gate material made of the polycrystalline silicon film with an impurity concentration of $1\times10^{20}$ atoms/$cm^3$ or higher, the thermal-oxidation insulating film greatly deteriorates the dimensional accuracy of width, in the gate-length direction, of the first gate material. The deterioration of the dimensional accuracy of the width, in the gate length direction, of the first gate material means deterioration of the dimensional accuracy of the gate length of the charge storage gate electrode prescribed by width, in the gate length direction, of the first gate material. Therefore, fluctuation occurs in the size of the overlapped region where the charge storage gate electrode and the drain region overlap and fluctuation also occurs in the size of the overlapped region where the charge storage gate electrode and the source region overlap, and thereby, the programming and erasing characteristics of the nonvolatile memory cell become extremely nonuniform.

Moreover, impurities in each of a pair of semiconductor regions serving as a source region and a drain region diffuse into the channel forming region under the charge storage gate electrode due to the heat in forming the thermal-oxidation insulating film (field insulating film) on the surfaces of the active and inactive regions of the semiconductor substrate. Therefore, the effective channel length between the source and drain regions decreases and the punch-through withstand voltage of the nonvolatile memory cell extremely lowers.

(2) In the case of a semiconductor integrated circuit device comprising the nonvolatile memory cell, when a first gate material is formed and, thereafter, a thermal-oxidation insulating film is formed through thermal oxidation on the surface of an active region of a semiconductor substrate, a gate bird's beak (thermal-oxidation insulating film) grows between the first gate material and the semiconductor substrate from the side wall, in the gate-length direction, of the first gate material toward the central portion of the material. The growth rate of the gate bird's beak depends on the size or arranged state of crystal powder (aggregate of crystal powder) of the first gate material. That is, fluctuation occurs in the gate bird's beak grown between the first gate material and the semiconductor substrate from the side wall, in the gate length direction, of the first gate material toward the central portion of the material. This gate bird's-beak fluctuation is increased by the concentration of the impurities introduced into the first gate material. For example, when a polycrystalline silicon film with an impurity concentration of $1\times10^{20}$ atoms/$cm^3$ or higher is used for the first gate material, the gate bird's beak fluctuation F (difference between high-growth-rate portion and low-growth-rate portion) is approx. 30 nm as shown in FIG. 23 (photograph taken by an electron microscope, showing a grown state of a gate bird's beak), FIG. 24(a) (sectional view of the principal part showing the grown state of a gate bird's beak), and FIG. 24(b) (top view of the principal part, corresponding to FIG. 24(a)). Therefore, in the case of a nonvolatile memory cell of which the programming and erasing operations are performed by the tunnel effect, the fluctuation of threshold voltage after the programming operation increases and the operational margin of the nonvolatile memory cell against the fluctuation of power source potential lowers as shown in FIG. 25 (characteristic diagram showing the fluctuation of the threshold voltage). That is, as shown in FIG. 24(a), the threshold voltage of a nonvolatile memory cell with a large extension of the gate bird's beak 40A shown by two-dot chain lines is different from that of a nonvolatile memory cell with the gate bird's beak 40B because the former nonvolatile memory cell decreases in the number of electrons tunneled from a charge storage gate electrode to a drain region compared to that of the latter nonvolatile memory cell. Thereby, the increase of the gate bird's beak fluctuation increases the threshold voltage fluctuation after the programming operation. In FIGS. 24(a) and 24(b), numeral 40 represents a gate bird's beak, 41 represents a gate insulating film, 41A represents the thickness of the gate insulating film 41, 42 represents a charge storage gate electrode (floating gate electrode), 43 represents a side wall spacer, 44 represents a drain region, and 10 represents a thermal-oxidation insulating film. Moreover, in FIG. 24(b), a floating gate electrode 42 is omitted so that FIG. 24(b) is easily viewed. Furthermore, FIG. 23 is a photograph taken by an electron microscope, corresponding to FIG. 24(b).

It is an object of the present invention to provide a technique for making uniform the programming and erasing characteristics of a nonvolatile memory cell to be mounted on a semiconductor integrated circuit device.

It is another object of the present invention to provide a technique for improving the punch-through withstand voltage of the nonvolatile memory cell.

It is still another object of the present invention to provide a technique for increasing the operational margin of the nonvolatile memory cell.

The above and other objects and novel features of the present invention will become apparent from the description of this specification and the accompanying drawings.

Representative featured aspects of the inventions disclosed in this application will be briefly described below.

(1) A method for fabricating a semiconductor integrated circuit device comprising a nonvolatile memory cell in which a charge storage gate electrode is formed on the surface of an active region of a semiconductor substrate through a first gate insulating film and a control gate electrode is formed on the surface of the charge storage gate electrode through a second gate insulating film, comprises the steps of (a) forming a first gate material of a silicon film with an impurity concentration of $1\times10^{19}$ atoms/$cm^3$ or lower, whose upper surface is covered with an oxidation-resistant mask, and whose width, in the gate-length direction is prescribed on part of the surface of the first gate insulating film, (b) forming a thermal-oxidation insulating film on the surface of the active region of the semiconductor substrate through thermal oxidation, (c) removing the oxidation-resistant mask, (d) forming a second gate material of a silicon film with an impurity concentration of $1\times10^{19}$ atoms/$cm^3$ or higher and whose width, in the gate length direction is prescribed, (e) forming a second gate insulating film on the surface of the second gate material, and (f) forming a third gate material on the surface of the second gate insulating film.

(2) The step of forming a thermal-oxidation insulating film on the surface of an inactive region of the semiconductor substrate is included before the step of forming the first gate insulating film so as to set the thickness of the thermal-oxidation insulating film formed on the surface of the active region of the semiconductor substrate smaller than that of the thermal-oxidation insulating film formed on the surface of the inactive region of the semiconductor substrate but larger than that of the first gate insulating film.

According the above means (1), when the thermal-oxidation insulating film is formed through thermal oxidation on the surface of the active region of the semiconductor substrate, it is possible to improve the dimensional accuracy of the width, in the gate length direction, of the first gate material and that of the gate length of the charge storage gate electrode prescribed by the width, in the gate-length direction, of the first gate material because the growth rate of the thermal-oxidation insulating film formed on each side wall, in the gate-length direction, of the first gate material made of a silicon film with an impurity concentration of $1 \times 10^{19}$ atoms/cm$^3$ or lower is lower than that of the thermal-oxidation insulating film formed on the side wall, in the gate-length direction of the first gate material made of the silicon film with an impurity concentration of $1 \times 10^{20}$ atom/cm$^3$ or higher. As a result, it is possible to decrease the fluctuation of the size of the overlapped region where the charge storage gate electrode and the drain region overlap, and that of the size of the overlapped region where the charge storage gate electrode and the source region overlap, and thereby it is possible to make uniform the programming and erasing characteristics of a nonvolatile memory cell.

Moreover, when a thermal-oxidation insulating film is formed through thermal oxidation on the surface of the active region of the semiconductor substrate, it is possible to decrease the threshold-voltage fluctuation after the programming operation of a nonvolatile memory cell which performs programming and erasing operations by the tunnel effect because the fluctuation of the gate bird's beak (thermal-oxidation insulating film) grown between the first gate material made of a silicon film with an impurity concentration of $1 \times 10^{19}$ atoms/cm$^3$ or lower and the semiconductor substrate from the side wall, in the gate-length direction, of the first gate material toward the central portion of the material is smaller than that (by 5 nm or less) of the gate bird's beak grown between the first gate material made of a silicon film with an impurity concentration of $1 \times 10^{20}$ atoms/cm$^3$ or higher and the semiconductor substrate from the side wall, in the gate-length direciton, of the first gate material toward the central portion of the material. As a result, it is possible to increase the operational margin of a nonvolatile memory cell against the fluctuation of the power source potential.

According to the above means (2), it is possible to decrease the diffusion length when impurities introduced into the oxidation-resistant mask in self-alignment with the mask diffuse into the channel forming region side under the first gate material because the heat treatment time taken to form the thermal-oxidation insulating film on the surface of the semiconductor substrate is shorter than that taken to form the thermal-oxidation insulating film on the surface of the inactive region of the semiconductor substrate. As a result, it is possible to ensure the effective channel length between the source and drain regions and thereby improve the punch-through withstand voltage of a nonvolatile memory cell.

BRIEF DESCRIPTION OF THE DRAWINGS

FIG. 11 is a top view of a principal part of the semiconductor integrated circuit device, for explaining how to fabricate the semiconductor integrated circuit device;

DETAILED DESCRIPTION OF THE PREFERRED EMBODIMENTS

The structure of the present invention will be described below in accordance with embodiments constituted by applying the present invention to a semiconductor integrated circuit device comprising a nonvolatile memory cell.

In all the drawings for explaining embodiments, components having the same function are denoted by the same symbols and their repetitive description will be omitted.

(Embodiment 1)

Figure 1:
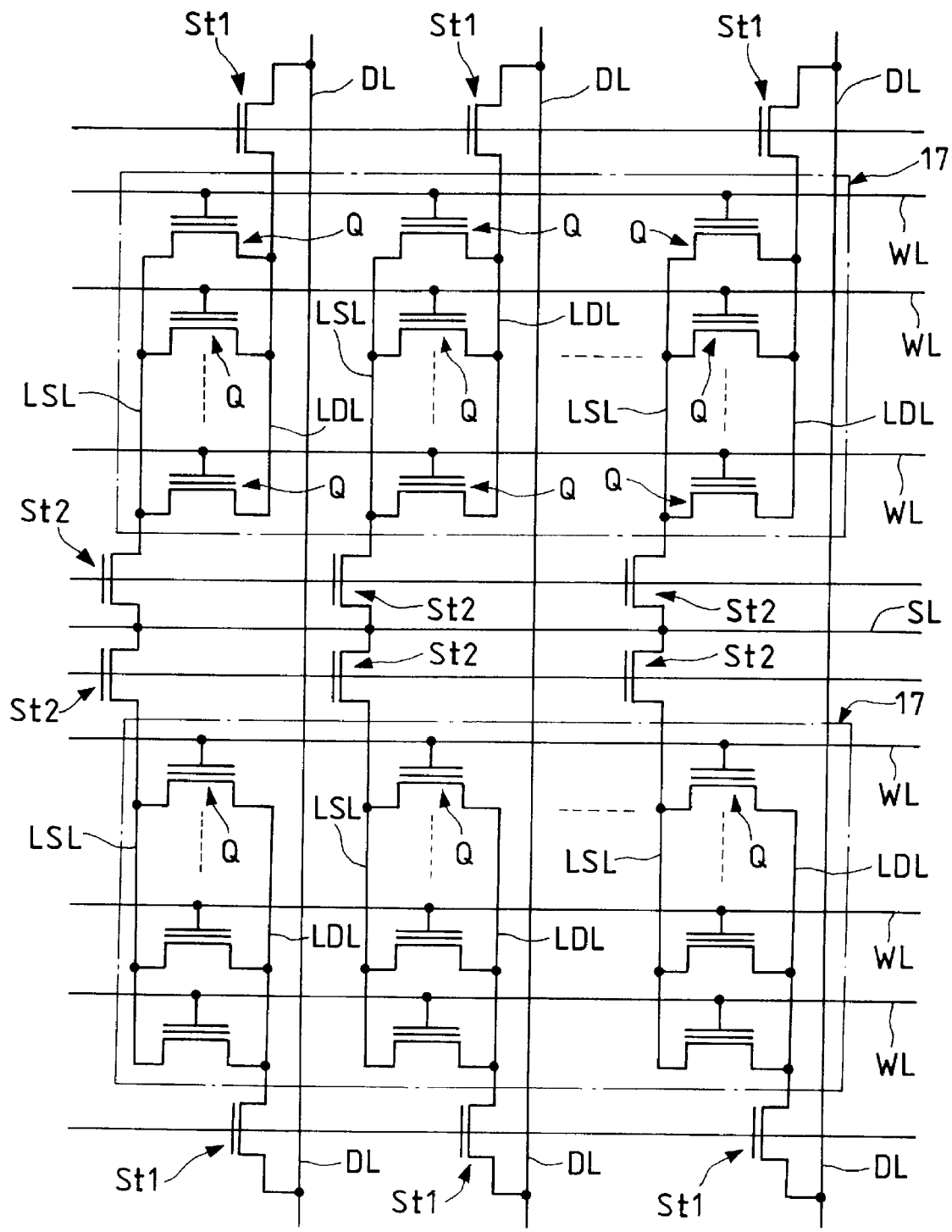
FIG. 1 is an equivalent circuit diagram of a principal part of a memory cell array, to be mounted on a semiconductor integrated circuit device of embodiment 1 of the present invention.

FIG. 1 shows a schematic structure (equivalent circuit diagram of a principal part) of the semiconductor integrated circuit device of embodiment 1 of the present invention.

As shown in FIG. 1, the semiconductor integrated circuit device has a memory cell array in which a plurality of memory blocks 17 are arranged like a matrix. A plurality of word lines WL extending in the X direction and a plurality of data lines D extending in the Y direction are arranged on the memory cell array.

A nonvolatile memory cell Q which undergoes programming and erasing operations by the tunnel effect is provided in each memory block 17. A plurality of nonvolatile memory cells Q are arranged in the extending directions of the word lines WL and the data lines DL. That is, each nonvolatile memory cell Q is provided in a region where each word line WL and data line DL intersect.

One data line DL is electrically connected to the drain region of each of the nonvolatile memory cells Q arranged in the extending direction of the data line DL through a selecting transistor St1 and a local data line LDL. Moreover, the source region of each of the nonvolatile memory cells Q arranged in the extending direction of one data line DL is electrically connected to a selecting transistor St2 through a local source line LSL. The local source lines LSL are electrically connected to the source lines SL through the selecting transistors St2. Moreover, one word line WL is electrically connected to the control gate electrode of each of the nonvolatile memory cells Q arranged in the extending direction of the word line WL. In the memory cell array thus fabricated, the erasing operation of the nonvolatile memory cells Q is performed every word line WL or every memory block 17 and, moreover, is performed for the whole memory cell array. As described later, the word lines WL are integrally formed with the control gate electrode of the nonvolatile memory cells Q.

Figure 2:
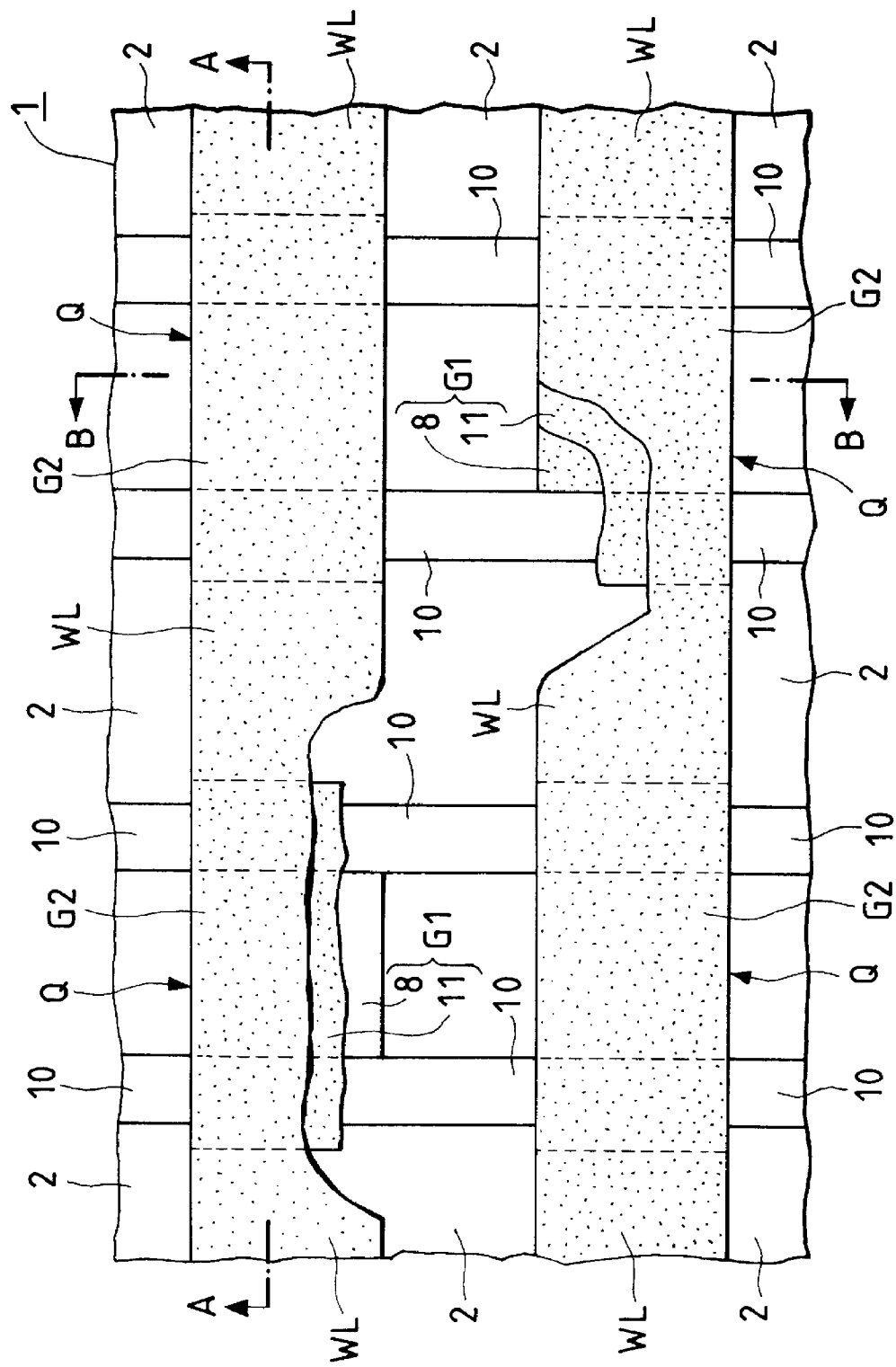
FIG. 2 is a top view of a principal part of the semiconductor integrated circuit device.

Then, the concrete structure of the nonvolatile memory cell Q mounted on a semiconductor integrated circuit device will described below referring to FIG. 2 (top view of a principal part), FIG. 3 (sectional view of the principal part of FIG. 2, taken along the line A—A in FIG. 2), and FIG. 4 (sectional view of the principal part of FIG. 2, taken along the line B—B in FIG. 2). In FIG. 2, an interlayer insulating film which will be described later and the data line DL are omitted so as to be easily viewed.

A plurality of the nonvolatile memory cells Q are arranged in the extending direction of the word lines WL which extend in the gate-length direction (X direction) and moreover, are arranged in the extending direction of data lines (not illustrated) which extend in the gate-width direction (Y direction).

Figure 3:
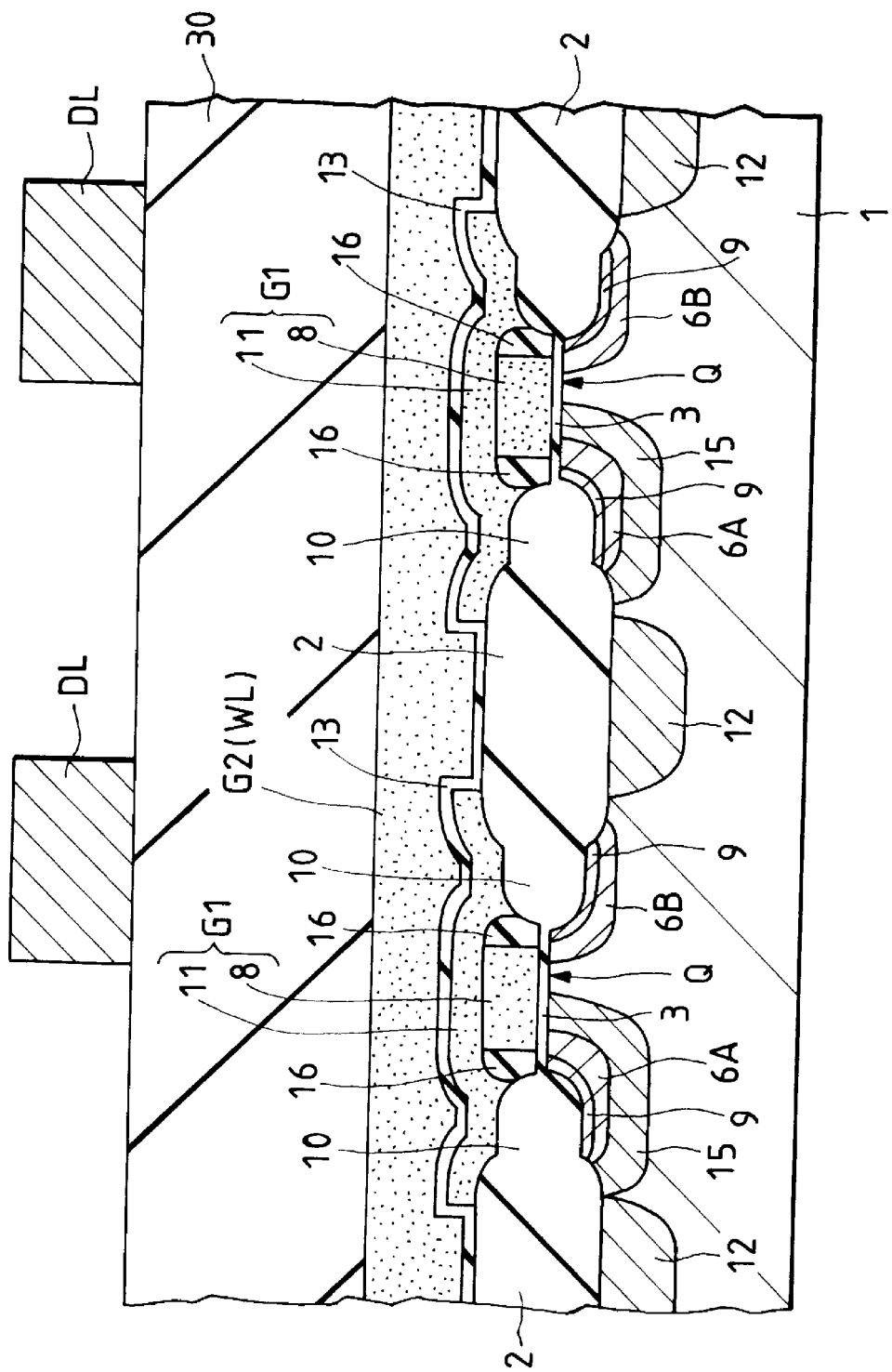
FIG. 3 is a sectional view of the principal part of the memory cell array of FIG. 2, taken along the line A—A in FIG. 3.

Each nonvolatile memory cell Q is fabricated on the surface of an active region of a p-type semiconductor substrate 1 as shown in FIG. 3. The nonvolatile memory cell Q mainly comprises the p-type semiconductor substrate 1 serving as a channel forming region, a first gate insulating film 3, a charge storage gate electrode (floating gate electrode) G1, a second gate insulating film 13, a control gate electrode G2, an n-type semiconductor region 6A serving as a source region, an n-type semiconductor region 6B serving as a drain region, a pair of $n^+$-type semiconductor regions 9 serving as a source region and a drain region, respectively, and a p-type semiconductor region 15 serving as a threshold voltage control region. That is, the nonvolatile memory cell Q comprises n-channel conductivity-type field effect transistor.

The first gate insulating film 3 is made of a silicon oxide film with a thickness of approx. 8 nm. The second gate insulating film 13 is formed into a multilayer structure in which, for example, a first silicon-oxide film, a silicon nitride film, and a second silicon-oxide film are superimposed in order. The thickness of the first silicon-oxide film is set to, e.g., approx. 5 nm, that of the silicon nitride film is set to, e.g., approx. 10 nm, and that of the second silicon-oxide film is set to, e.g., approx. 4 nm.

The charge storage gate electrode (also referred to as a floating gate electrode) G1 is made of a first gate material 8 and a second gate material 11 superimposed on the surface of the first gate material 8. The second gate material 11 is made of a polycrystalline silicon film containing impurities (e.g., phosphorus (P)) for decreasing a resistance value. The thickness of the polycrystalline silicon film is set to, e.g., approx. 100 nm and the impurity concentration of the film is set to approx. $3.5 \times 10^{20}$ atoms/$cm^3$. The impurities are introduced into the polycrystalline silicon film while or after the polycrystalline silicon film is deposited. The first gate material 8 is made of a polycrystalline silicon film containing impurities {e.g., phosphorus (P)} for decreasing a resistance value. The thickness of the polycrystalline silicon film is set to, e.g., approx. 50 nm and the impurity concentration of the film is set to approx. $2.5 \times 10^{20}$ atoms/$cm^3$. The impurities are introduced into the polycrystalline silicon film from the second gate material 11 by thermal diffusion (drive-in diffusion). That is, the impurities are introduced into the first gate material 8 by impurity diffusion from the second gate material 11.

The width, in the gate-length direction, of the first gate material 8 prescribes the gate length of the charge storage gate electrode G1. The width, in the gate-length direction, of the first gate material 8 is set to, say, approx. 0.5 $\mu$m. That is, the gate length of the charge storage gate electrode G1 is set to 0.5 $\mu$m.

A side wall spacer 16 is formed on each side wall, in the gate-length direction, of the first gate material 8. The side wall spacer 16 is made of a silicon oxide film deposited by a CVD (Chemical Vapor Deposition) method.

The control gate electrode G2 is made of a polycrystalline silicon film containing impurities (e.g. phosphorus) for decreasing a resistance value. The thickness of the polycrystalline silicon film is set to, e.g., approx. 200 nm and the impurity concentration of the film is set to, e.g., approx. $3.5 \times 10^{20}$ atoms/$cm^3$.

The n-type semiconductor region 6A serving as a source region is formed in an active region of the p-type semiconductor substrate 1 between the thermal-oxidation insulating film (field insulating film) 2 and the first gate material 8 and its impurity concentration is set to, say, approx. $5 \times 10^{19}$ atoms/cm$^3$. The n-type semiconductor region 6B serving as a drain region is formed in the active region of the p-type semiconductor substrate 1 between the thermal-oxidation insulating film 2 and the first gate material 8 and its impurity concentration is set to, say, approx. $5 \times 10^{20}$ atoms/cm$^3$. Each of a pair of the n$^+$-type semiconductor region 9 serving as a source region and a drain region respectively is formed on the respective surfaces of the n-type semiconductor region 6A and the n-type semiconductor region 6B and its impurity concentration is set to, e.g., approx. $7 \times 10^{20}$ atoms/cm$^3$. That is, the impurity concentrations of a pair of the n-type semiconductor regions 9 are set to values higher than the respective impurity concentrations of the n-type semiconductor regions 6A and 6B. The nonvolatile memory cell Q has an LDD (Lightly Doped Drain) structure in which the impurity concentration of part of drain regions on the channel forming region side is set to a value lower than that of the other part.

The p-type semiconductor region 15 serving as a threshold voltage control region is formed on the surface of the active region of the p-type semiconductor substrate 1 under the n-type semiconductor region 6A, serving as a source region, and the impurity concentration of the region 15 is set to, e.g., approx. $5 \times 10^{17}$ atoms/cm$^3$. The p-type semiconductor region 15 is formed by selectively introducing p-type impurities into the surface of the p-type semiconductor substrate 1 by means of, for example, an ion implantation method after the step of forming the first gate material 8 and before the step of forming the n-type semiconductor region 6A serving as a source region and the n-type semiconductor region 6B serving as a drain region.

The width, in the gate-length direction, of the active region of the p-type semiconductor substrate 1 is prescribed by a pair of thermal-oxidation insulating films (field insulating films) 2 formed on the surface of the inactive region of the p-type semiconductor substrate 1. Each of a pair of the thermal-oxidation insulating films 2 is made of a silicon oxide film formed by a known selective oxidation method and its thickness is set to, e.g., approx. 500 nm. Each of a pair of the thermal-oxidation insulating films 2 extends in the gate-width direction and electrically isolating the non-volatile memory cells Q arranged in the extending direction of the word line WL from each other. That is, the thermal-oxidation insulating film 2 is used as an element isolating film.

The p-type semiconductor region 12 serving as a channel stopper region is formed under the thermal-oxidation insulating film 2. The impurity concentration of the p-type semiconductor region 12 is set to, say, approx. $4 \times 10^{17}$ atoms/cm$^3$.

Each of the n-type semiconductor region 6A serving as a source region and the n-type semiconductor region 6B serving as a drain region is continuously formed in the gate-width direction so that each of them is integrated with each of the n-type semiconductor regions 6A and 6B of a plurality of nonvolatile memory cells Q arranged in the gate-width direction. Moreover, each of a pair of the n-type semiconductor regions 9 serving as a source region and a drain region respectively is continuously formed in the gate-width direction so that each of them is integrated with each of a pair of the n-type semiconductor regions 9 serving as a source region and a drain region respectively of a plurality of nonvolatile memory cells Q arranged in the gate-width direction. That is, each of source and drain regions of a nonvolatile memory cell Q is electrically connected to each of source and drain regions of other nonvolatile memory cell Q arranged in the gate-width direction.

The n-type semiconductor region 6A serving as a source region and one of the n$^+$-type semiconductor regions 9 serving as a source region are used as a local source line (LSL). Moreover, the n-type semiconductor region 6B serving as a drain region and the other n$^+$-type semiconductor region 9 serving as a drain region are used as a local data line (LDL). That is, the semiconductor integrated circuit device of this embodiment has a structure in which a local data line (LDL) is buried in the p-type semiconductor substrate 1, and comprises an AND-type flash memory.

A pair of thermal-oxidation insulating films 10 are formed on each surface of the p-type semiconductor substrate 1 between the thermal-oxidation insulating film 2 and the first gate material 8. Each of the thermal-oxidation insulating films 10 is formed on each surface of the n-type semiconductor regions 6A and 6B and a pair of the n-type semiconductor regions 9. Each of the thermal-oxidation insulating films 10 extends in the gate-width direction. Each of the thermal-oxidation insulating films 10 is formed by a thermal oxidation method and its thickness is set to, e.g., approx. 150 nm.

The second gate material 11 of the charge storage gate electrode G1 is formed on the surface of the first gate material 8 and on the surface of the thermal-oxidation insulating film 10. That is, the width, in the gate-length direction, of the second gate material 11 is larger than the width, in the gate-length direction, of the first gate material 8 for prescribing the gate length of the charge storage gate electrode G1. Thus, by making the width, in the gate-length direction, of the second gate material 11 larger than that of the first gate material 8, it is possible to increase the area of the charge storage gate electrode G1 without increasing the gate length of the charge storage gate electrode G1. Therefore, it is possible to accelerate the operation speed of the nonvolatile memory cell Q and, moreover, increase the quantity of charges stored in the nonvolatile memory cell Q.

The control gate electrode (also referred to as a control gate electrode) G2 of a nonvolatile memory cell Q is integrally formed with the word line WL extending in the gate-length direction and electrically connected to the control gate electrode G2 of other nonvolatile memory cells Q arranged in the gate-length direction. The control gate electrode G2 and the word line WL are made of, for example, a polycrystalline silicon film. Impurities for decreasing a resistance value are introduced into the polycrystalline silicon film.

An interlarger insulating film 30 is formed on the whole surface of the p-type semiconductor substrate 1 including the surfaces of the control gate electrode G2 and the word line WL of the nonvolatile memory cell Q. The data line DL extends over the interlayer insulating film 30. The interlayer insulating film 30 is made of, for example, a silicon oxide film and the data line DL is made of a metallic film such as an aluminum film or aluminum alloy film.

Figure 4:
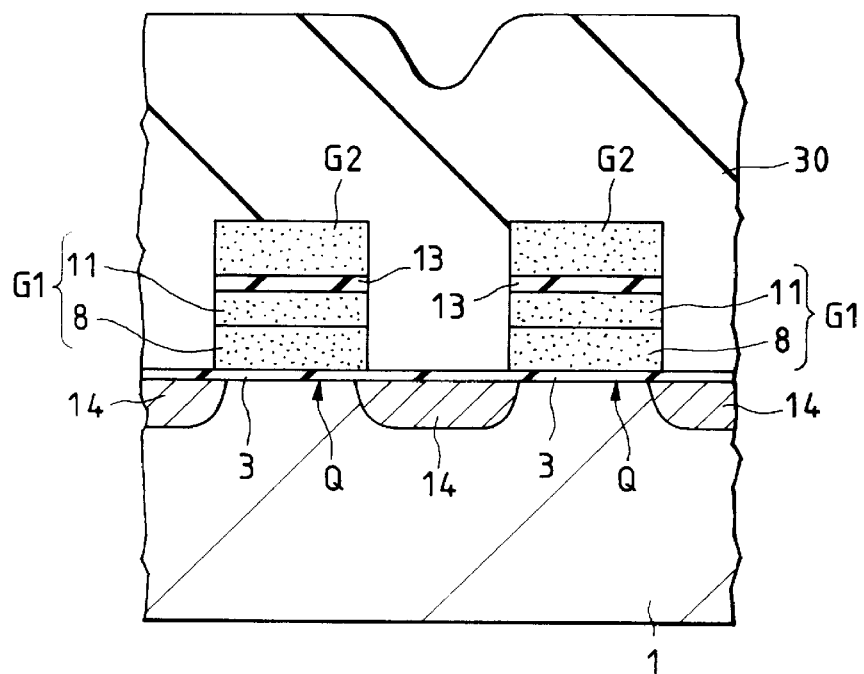
FIG. 4 is a sectional view of the principal part of the memory cell array of FIG. 2, taken along the line B—B in FIG. 2.

Moreover, a p-type semiconductor region 14 serving as a channel stopper region, as shown in FIG. 4, is formed on the surface of the p-type semiconductor substrate 1 between the nonvolatile memory cells Q arranged in the gate-width direction.

Then, a method for fabricating a semiconductor integrated circuit device comprising the nonvolatile memory cell Q will be described below referring to FIGS. 5 to 7 (sectional views of principal parts for explaining the method) and FIGS. 8 to 11 (top views of principal parts for explaining the method).

First, a p-type semiconductor substrate 1 made of single-crystal silicon is prepared.

Figure 5:
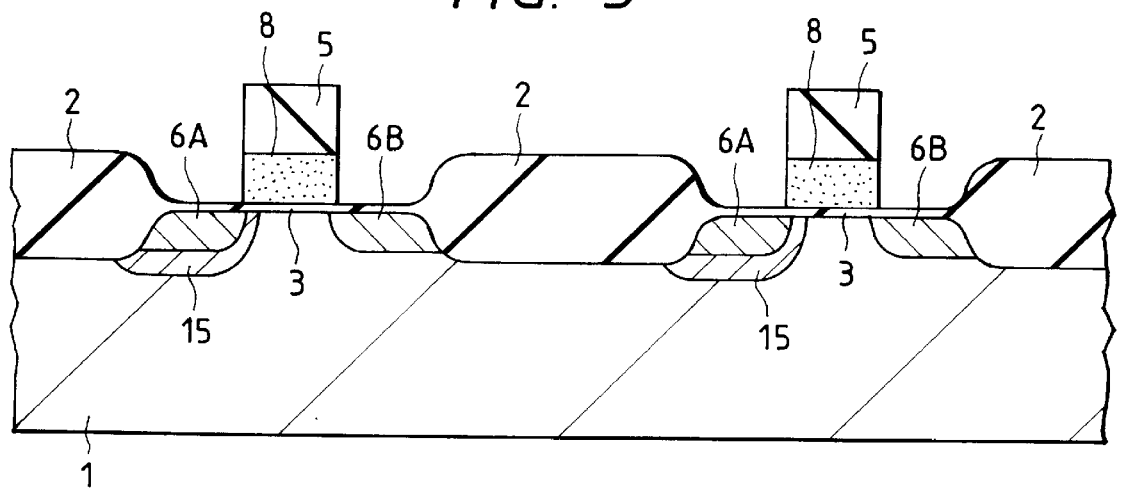
FIG. 5 is a sectional view of a principal part of the semiconductor integrated circuit device, for explaining how to fabricate the semiconductor integrated circuit device.
Figure 8:
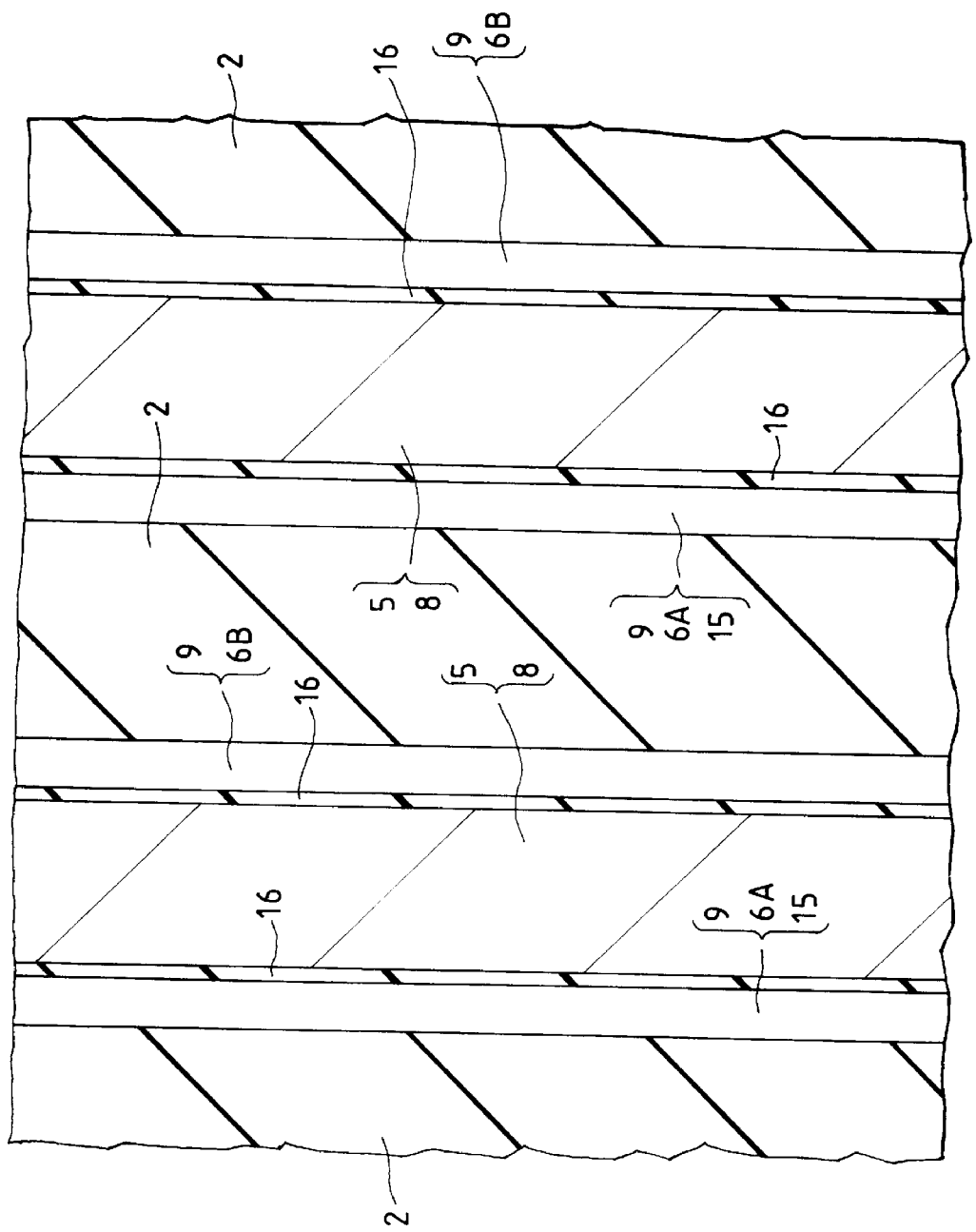
FIG. 8 is a top view of a principal part of the semiconductor integrated circuit device, for explaining how to fabricate the semiconductor integrated circuit device.

Then, as shown in FIGS. 5 and 8, a pair of thermal-oxidation insulating films (field insulating films) 2 are formed on the surface of the inactive region of the p-type semiconductor substrate 1. Each of the thermal-oxidation insulating films 2 is made of a thermal-oxidation silicon film formed by, for example, a known selective oxidation method and extends in the gate-width direction (Y direction). Each of the thermal-oxidation insulating films 2 prescribes (i.e., defines) the (X-directional) width, in the gate-length direction, of the active region of the p-type semiconductor substrate 1.

Then, a first gate insulating film 3 is formed on the surface of the active region of the p-type semiconductor substrate 1 prescribed by a pair of the thermal-oxidation insulating films 2. The first gate insulating film 3 is made of a silicon oxide film formed by a thermal oxidation method.

Then, a polycrystalline silicon film with an impurity concentration of $1 \times 10^{19}$ atoms/cm$^3$ or lower is formed on the whole surface of the substrate including the surfaces of the thermal-oxidation insulating film 2 and the first gate insulating film 3. The polycrystalline silicon film can be formed by depositing a non-doped polycrystalline silicon film by, for example, a CVD method.

Then, an oxidation-resistant mask 5 extending in the gate-width direction is formed on part of the surface of the polycrystalline silicon film on the first gate insulating film 3.

Then, the polycrystalline silicon film is patterned to form a first gate material 8 which is made of a polycrystalline silicon film with an impurity concentration of $1 \times 10^{19}$ atoms/cm$^3$ or lower, whose upper surface is covered with the oxidation-resistant mask 5, and whose width, in the gate-length direction is prescribed, on part of the surface of the first gate insulating film 3.

Then, p-type impurities {e.g. boron (B)} are selectively introduced into the surface of one p-type semiconductor substrate 1 between the thermal-oxidation insulating film 2 and the oxidation-resistant mask 5 in self-alignment with the thermal-oxidation insulating film 2 and the oxidation-resistant mask 5 to form a p-type semiconductor region 15 serving as a threshold voltage control region. The p-type impurities are introduced into the surface of the p-type semiconductor substrate 1 with, for example, an acceleration energy of 100 keV and a dose of $1 \times 10^{14}$ atoms/cm$^2$ from a direction at an angle of 60° to the surface of the p-type semiconductor substrate 1.

Then, n-impurities {e.g. arsenic (As)} are selectively introduced into the surface of one p-type semiconductor substrate 1 between the thermal-oxidation insulating film 2 and the oxidation-resistant mask 5 in self-alignment with the thermal-oxidation insulating film 2 and the oxidation-resistant mask 5 to form an n-type semiconductor region 6A serving as a source region.

Then, n-type impurities (e.g., arsenic) are selectively introduced into the surface of the other p-type semiconductor substrate 1 between the thermal-oxidation insulating film 2 and the oxidation-resistant mask 5 in self-alignment with the thermal-oxidation insulating film 2 and the oxidation-resistant mask 5 to form an n-type semiconductor region 6B serving as a drain region.

Figure 6:
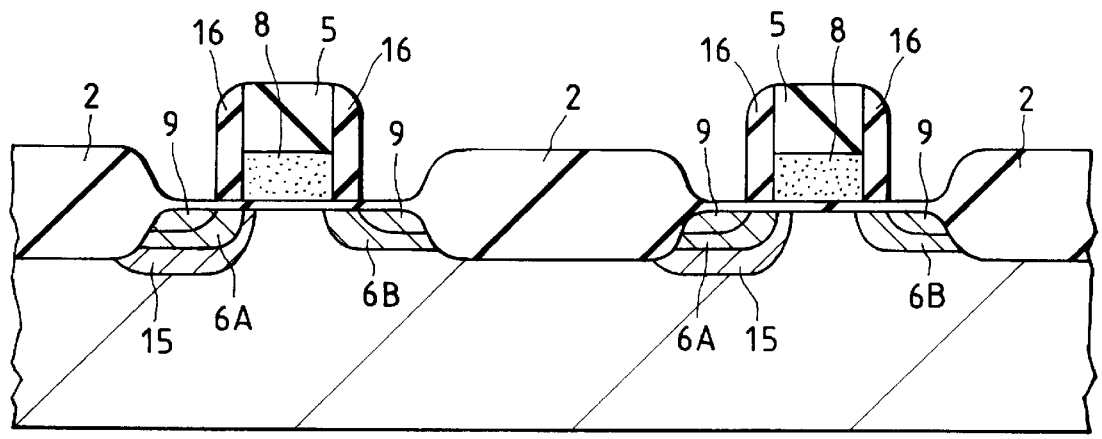
FIG. 6 is a sectional view of a principal part of the semiconductor integrated circuit device, for explaining how to fabricate the semiconductor integrated circuit device.
Figure 7:
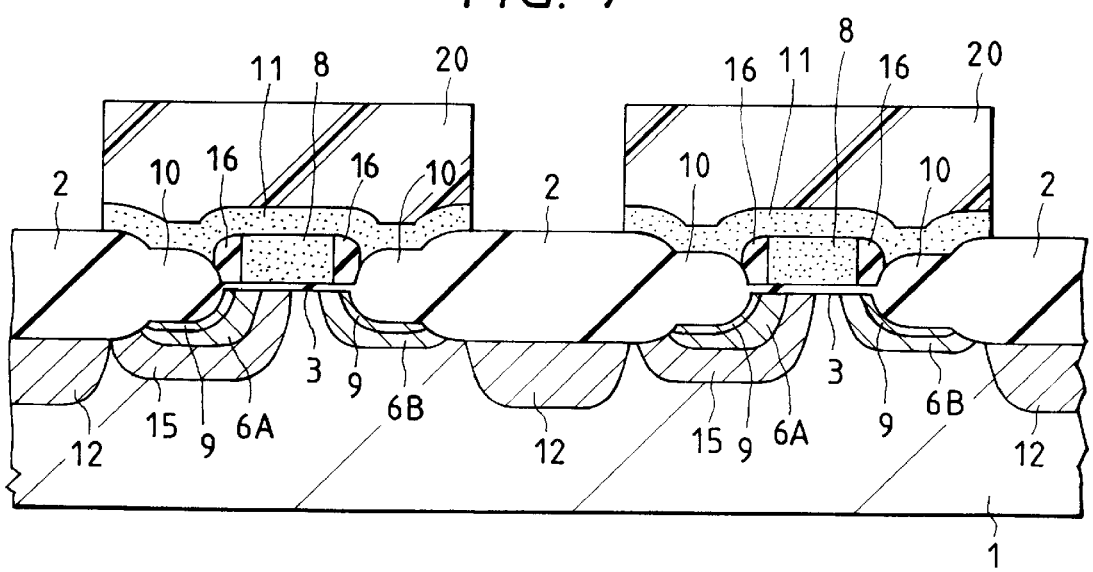
FIG. 7 is a sectional view of a principal part of the semiconductor integrated circuit device, for explaining how to fabricate the semiconductor integrated circuit device.
Figure 9:
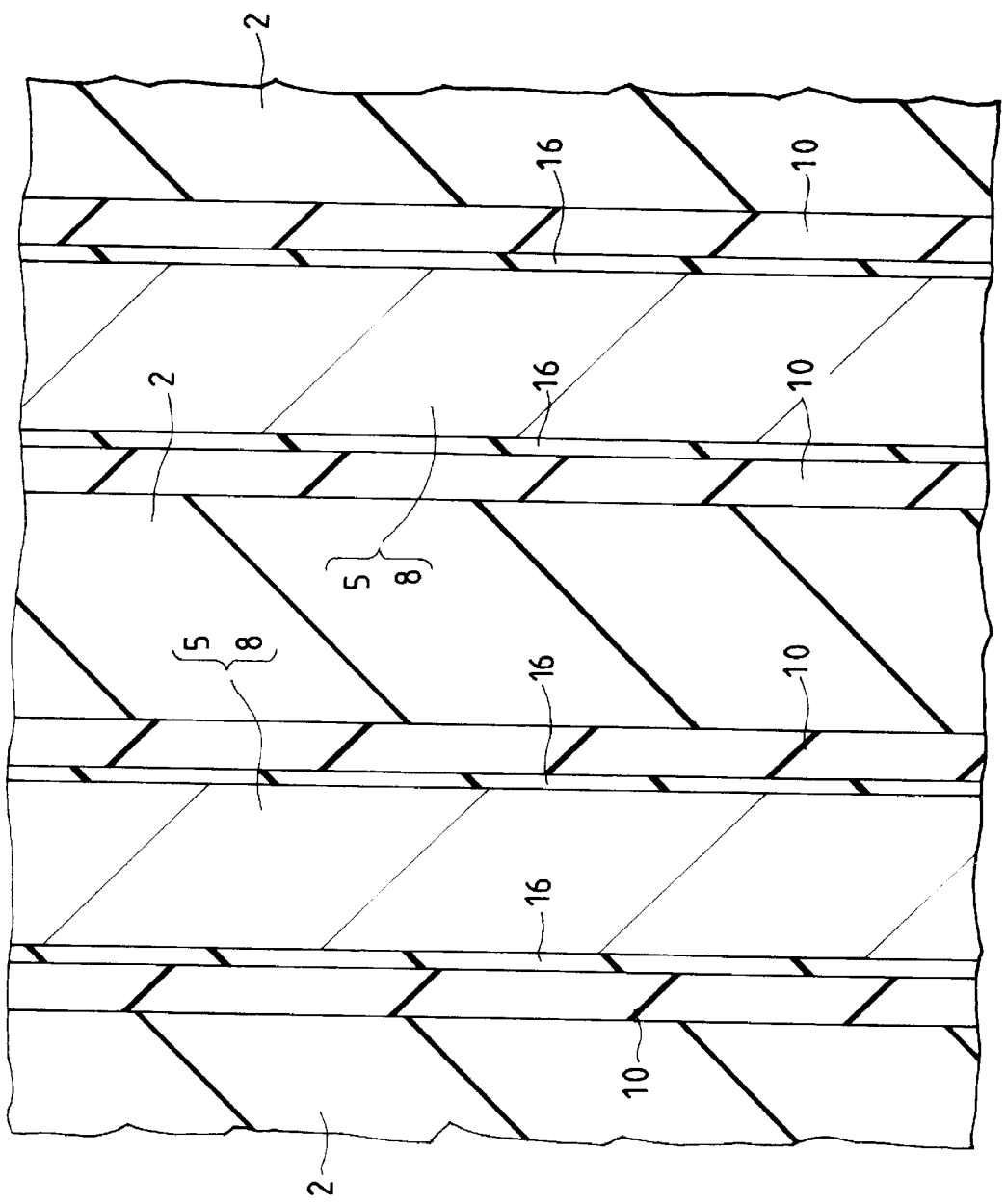
FIG. 9 is a top view of a principal part of the semiconductor integrated circuit device, for explaining how to fabricate the semiconductor integrated circuit device.
Figure 10:
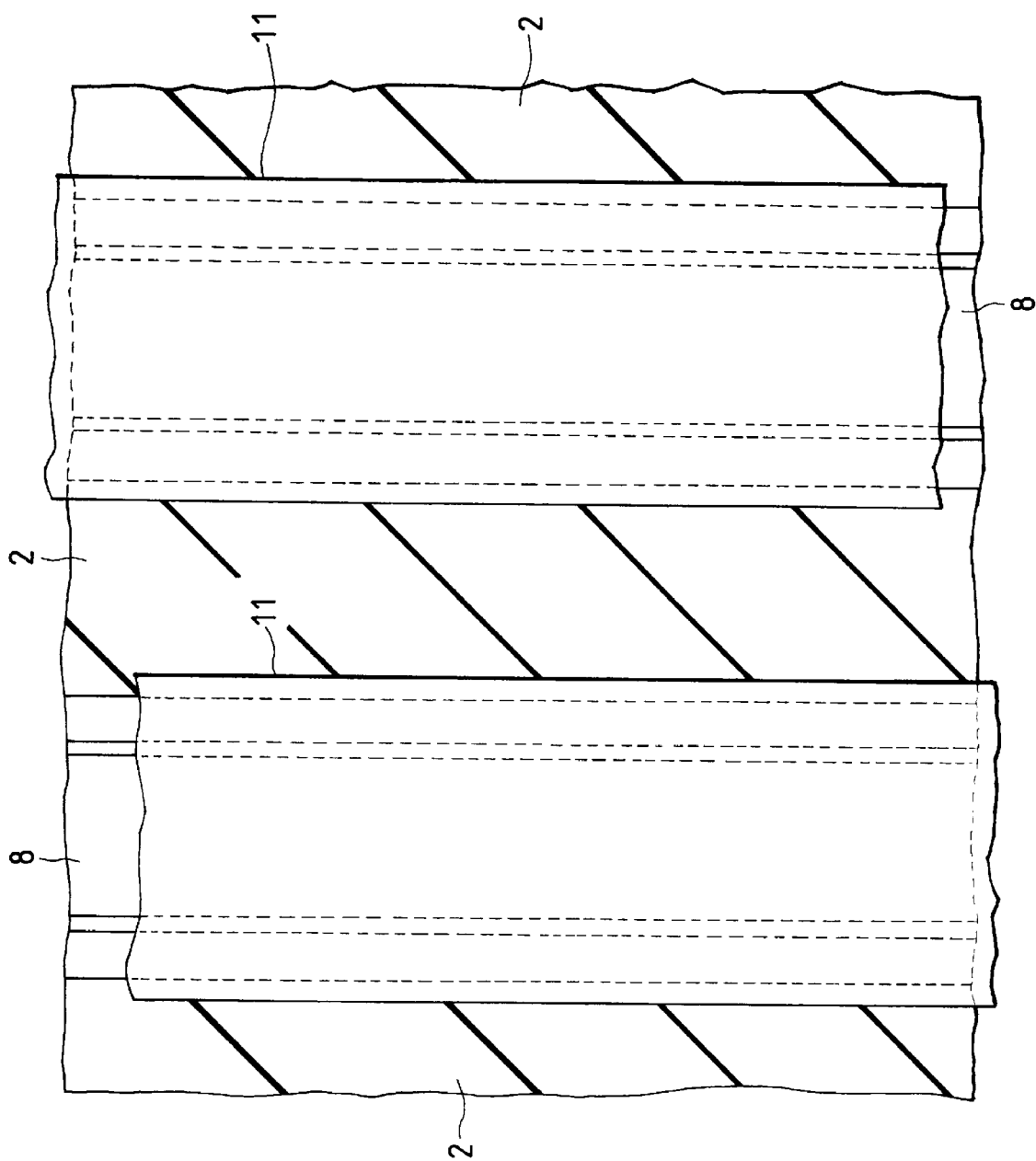
FIG. 10 is a top view of a principal part of the semiconductor integrated circuit device, for explaining how to fabricate the semiconductor integrated circuit device.

Then, as shown in FIGS. 6 and 9, a side wall spacer 16 is formed on each side wall, in the gate-length direction, of the oxidation-resistant mask 5 and the gate material 8. The side wall spacer 16 s made of, for example, a silicon oxide film. The side wall spacer 16 is formed by forming a silicon oxide film on the whole surface of the p-type semiconductor substrate 1 including the surface of the oxidation-resistant mask 5 by a CVD (Chemical Vapor Deposition) method and anisotropically etching the silicon oxide film.

Then, n-type impurities (e.g., phosphorus) are introduced into the surface of the p-type semiconductor substrate 1 between the thermal-oxidation insulating film 2 and the side wall spacer 16 in self-alignment with the thermal-oxidation insulating film 2 and the side wall spacer 16 to form a pair of n-type semiconductor regions 9 serving as a source region and a drain region respectively on each surface of the n-type semiconductor regions 6A and 6B. The impurity concentration of each of the n-type semiconductor regions 9 is set to a value larger than those of the n-type semiconductor regions 6A and 6B.

Then, a pair of thermal-oxidation insulating films 10 are formed through thermal oxidation on the p-type semiconductor substrate 1 between the thermal-oxidation insulating film 2 and the side wall spacers 16. The thickness of each of the thermal-oxidation insulating films 10 is set to a value smaller than that of the thermal-oxidation insulating film 2 but larger than that of the first gate insulating film 3. Thermal oxidation is performed in water vapor in an oxidation temperature region in which surface reaction strongly tends to control the degree of oxidation of p-type semiconductor substrate 1.

In this step, a thermal-oxidation insulating film is also formed on each side, in the gate-length direction, of the first gate material 8. However, because the first gate material 8 is made of a polycrystalline silicon film with an impurity concentration of $1 \times 10^{19}$ atoms/cm$^3$ or lower, the growth rate of the thermal-oxidation insulating film formed on each side, in the gate-length direction, of the first gate material 8 is lower than that of the thermal-oxidation insulating film formed on each side, in the gate-length direction, of the first gate material made of a polycrystalline silicon film with an impurity concentration of $1 \times 10^{20}$ atoms/cm$^3$ or higher. The reason why the growth rate of the thermal-oxidation insulating film is low is that the impurities concentration does not have a function to increase the growth rate.

Moreover, because each side, in the gate-length direction, of the first gate material 8 is covered with the side wall spacer 16, the growth rate of the thermal-oxidation insulating film formed on each side, in the gate-length direction, of the first gate material 8 is lower than that of the thermal-oxidation insulating film formed on each side, in the gate-length direction, of the first gate material not covered with the side wall spacer 16.

Furthermore, as described later referring to FIGS. 12(a) and 12(b) and FIG. 13, a gate bird's beak GB (thermal-oxidation insulating film) grown from the side wall, in the gate-length direction, of the first gate material 8 toward the central portion of the material 8 is formed between the first gate material 8 and the p-type semiconductor substrate 1. However, because the first gate material 8 is made of a polycrystalline silicon film with an impurity concentration of $1 \times 10^{19}$ atoms/cm$^3$ or lower, the fluctuation of gate bird's beak GB (thermal-oxidation insulating film) grown from the side wall, in the gate-length direction, of the first gate material 8 toward the central portion of the material 8 between the first gate material 8 and the p-type semiconductor substrate 1 is smaller than that of a gate bird's beak GB grown from the side wall, in the gate-length direction, of a first gate material made of a polycrystalline silicon film with an impurity concentration of $1 \times 10^{20}$ atoms/cm$^3$ or higher toward the central portion of the first material between the first material and the semiconductor substrate. The reason why the fluctuation of the gate bird's beak GB is small is that the impurity concentration does not have a function to increase the speed.

Moreover, because the thickness of the thermal-oxidation insulating film 10 is set to a value smaller than that of the thermal-oxidation insulating film 2 formed by a selective oxidation method, the heat treatment time required to form the thermal-oxidation insulating film 10 is shorter than that to form the thermal-oxidation insulating film 2.

Then, the mask 5 is removed. In this case, part of the side wall spacer 16 is also removed.

Then, a polycrystalline silicon film is formed on the whole surface of the p-type semiconductor substrate 1 including each surface of the thermal-oxidation insulating film 10 and the first gate material 8 by, for example, a CVD method. Impurities (e.g. phosphorus) for decreasing a resistance value are introduced into the polycrystalline silicon film while the polycrystalline silicon film is deposited.

Then, a mask 20 whose width, in the gate-length direction is prescribed is formed on the surface of the oxidation insulating film 10 and part of the surface of the polycrystalline silicon film on the gate material 8. The mask 20 is made of, for example, a photoresist film and extends in the gate-width direction.

Then, the polycrystalline silicon film is patterned and a second gate material 11 which is made of a polycrystalline silicon film containing impurities and whose width, in the gate-length direction, is prescribed is formed on each surface of the oxidation insulating film 10 and the first gate material 8.

Then, p-type impurities are introduced into the surface of the p-type semiconductor substrate 1 under the thermal-oxidation insulating film 2 by, for example, an ion implantation method in self-alignment with the mask 20 to form a p-type semiconductor region 12 serving as a channel stopper region.

Then, the mask 20 is removed.

Then, thermal diffusion is performed to diffuse the impurities introduced into the second gate material 11 in the first gate material 8. The thermal diffusion is performed in an atmosphere at a temperature of approx. 850° C. for approx. 10 min. In this step, the resistance value of the first gate material 8 is decreased by the impurities introduced from the second gate material 11 by the diffusion.

Then, a second gate insulating film 13 is formed on the surface of the second gate material 11. The second gate insulating film 13 is made of a multilayer film formed by superimposing a first silicon oxide film, a silicon nitride film, and a second silicon oxide film in order by, for example, a CVD method.

Then, a third gate material is formed on the surface of the second gate insulating film 13. The third gate material is made of, for example, a polycrystalline silicon film containing impurities for decreasing a resistance value.

Then, as shown in FIG. 11, the third gate materials is patterned to prescribe the width in the gate-length direction, and the first and second gate materials 8, 11 are patterned to prescribe the widths in the gate-length direction in order, so as to form a control gate electrode G2 and a word line (WL) with the third gate material, and to form a charge storage gate electrode G1 with the second gate material 11 and the first gate material 8, respectively. At this step a nonvolatile memory cell Q is almost completed.

Then, p-type impurities are introduced into the surface of the p-type semiconductor substrate 1 between the above nonvolatile memory cell Q and an another nonvolatile memory cell Q arranged in the gate-width direction in self-alignment with these control gate electrodes 13 to form a p-type semiconductor region 14 serving as a channel stopper region. In this step, the channel forming regions of a plurality of nonvolatile memory cells Q arranged in the gate-width direction are isolated from each other by the p-type semiconductor region 14.

Then, an interlayer insulating film 30 is formed on the whole surface of the p-type semiconductor substrate 1 including the word line (WL) and the control gate electrode G2 and, thereafter, a data line DL is formed on the whole surface of the p-type semiconductor substrate 1 including the interlayer insulating film 30. The data line DL is made of a metallic film such as an aluminum film or an aluminum alloy film.

It is also possible to set the step of introducing impurities (e.g. phosphorus) into the polycrystalline silicon film after the step of forming the polycrystalline silicon film on the whole surface of the p-type semiconductor substrate 1 including each surface of the thermal-oxidation insulating film 10 and the first gate material 8 by, for example, a CVD method and before the step of forming the mask 20.

Figure 12A:
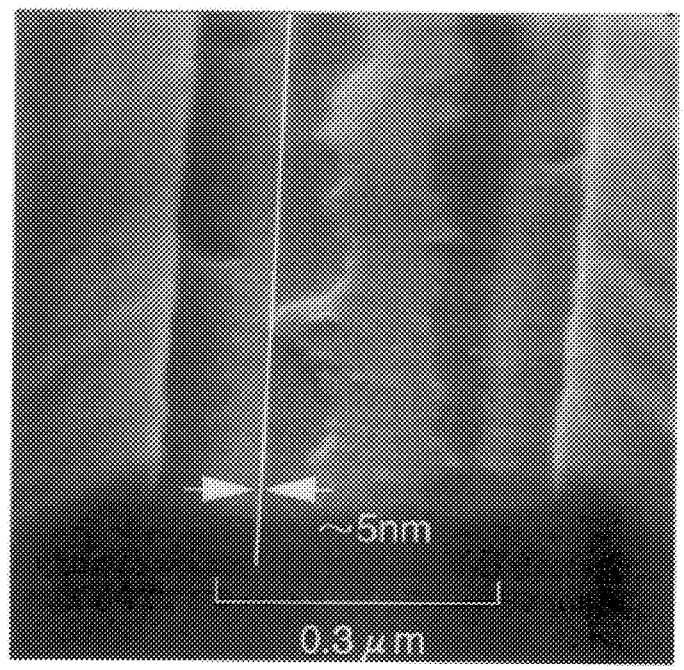
FIG. 12(a) is a photograph taken by an electron microscope, showing the grown state of a gate bird's beak.
Figure 12B:
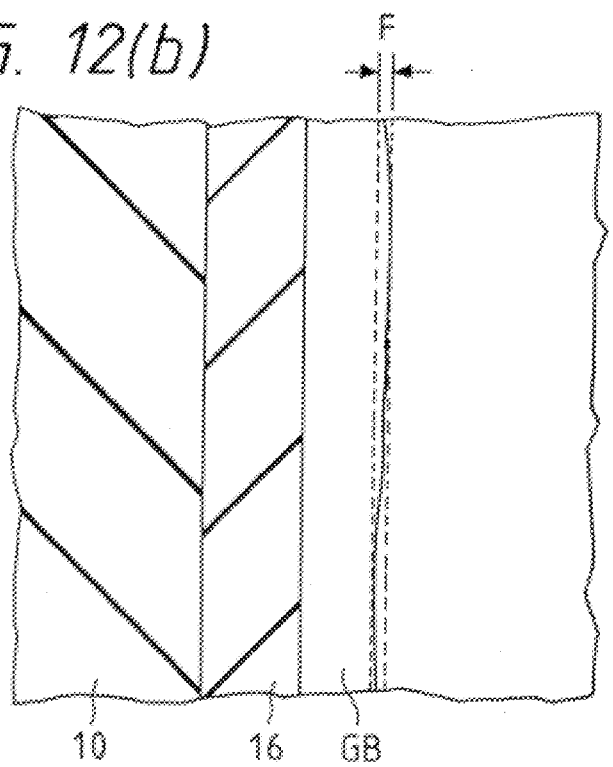
FIG. 12(b) is a top view of a principal part, corresponding to FIG. 12(a)

The nonvolatile memory cell Q thus constituted makes it possible to decrease the fluctuation F of the gate bird's beak GB grown from the side wall, in the gate-length direction, of the first gate material 8 toward the central portion of the material 8 between the first gate material 8 and the p-type semiconductor substrate 1 to 5 nm or less as shown in FIG. 12(a) (electron-microscopic photograph showing a grown state of a gate bird's beak) and FIG. 12(b) (top view of a principal part corresponding to FIG. 12(a)). The decrease of the fluctuation F of gate bird's beak GB suppresses the fluctuation of the threshold voltage after programming as shown by (a) in FIG. 13 (correlation diagram showing the relation between the fluctuation of the gate bird's beak and the fluctuation of the threshold voltage after programming).

Figure 13:
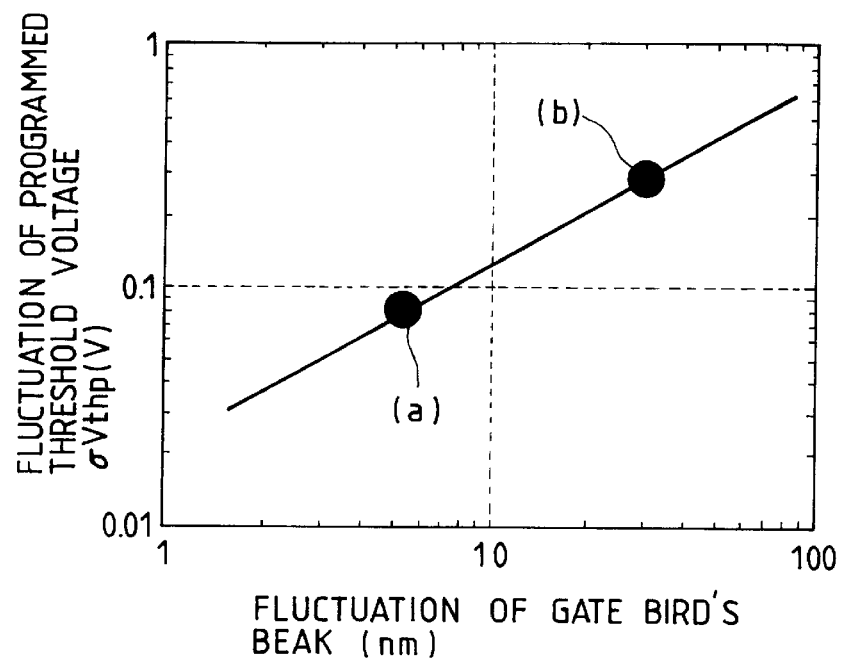
FIG. 13 is a correlation diagram showing the relation between the fluctuation of the gate bird's beak and the threshold voltage of the nonvolatile memory cell, in which the x axis is marked with the degree of fluctuation of the front end dimension of the gate bird's beak and the y axis is marked with the degree of the fluctuation of the program threshold voltage.
Figure 23:
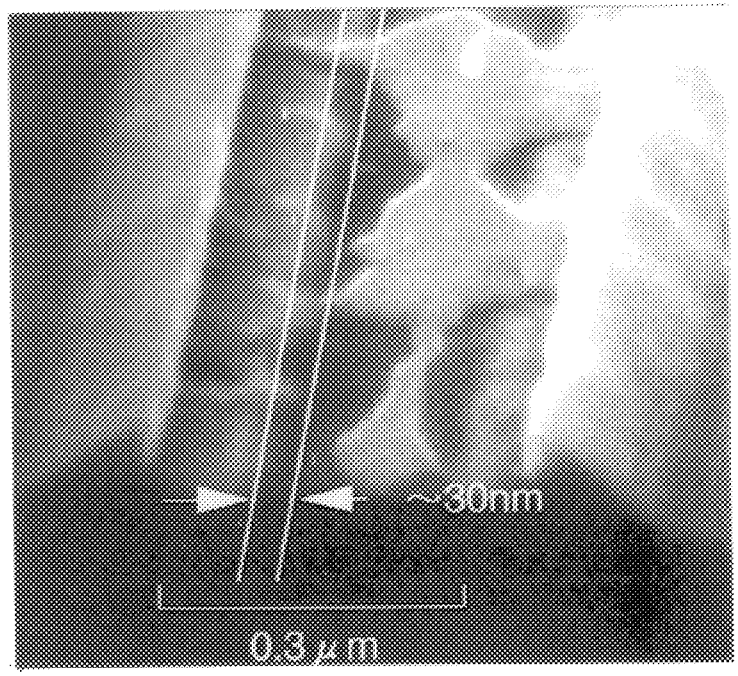
FIG. 23 is an electron-microscopic photograph showing a grown state of a conventional gate bird's beak.
Figure 24A:
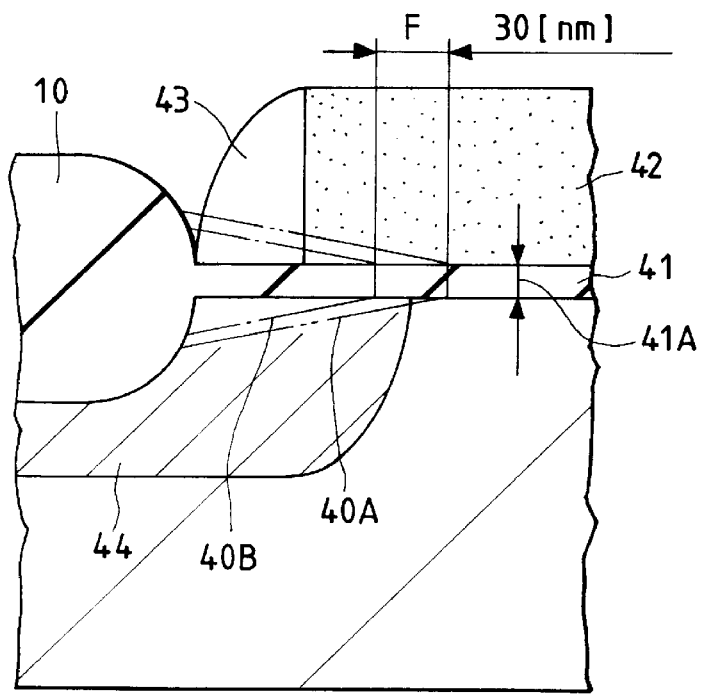
FIG. 24(a) is a sectional view of a principal part showing a grown state of a conventional gate bird's beak.
Figure 24B:
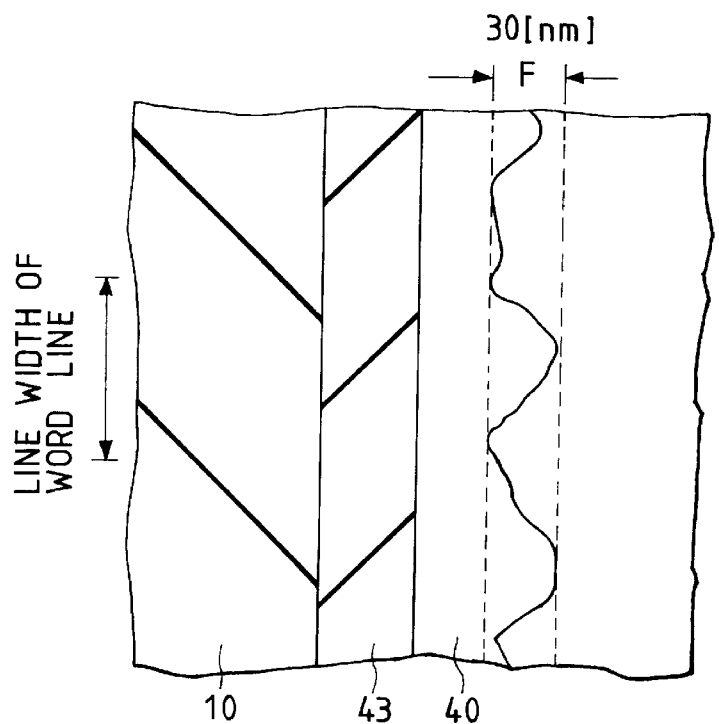
FIG. 24(b) is a top view of a principal part corresponding to FIG. 24(a)
Figure 25:
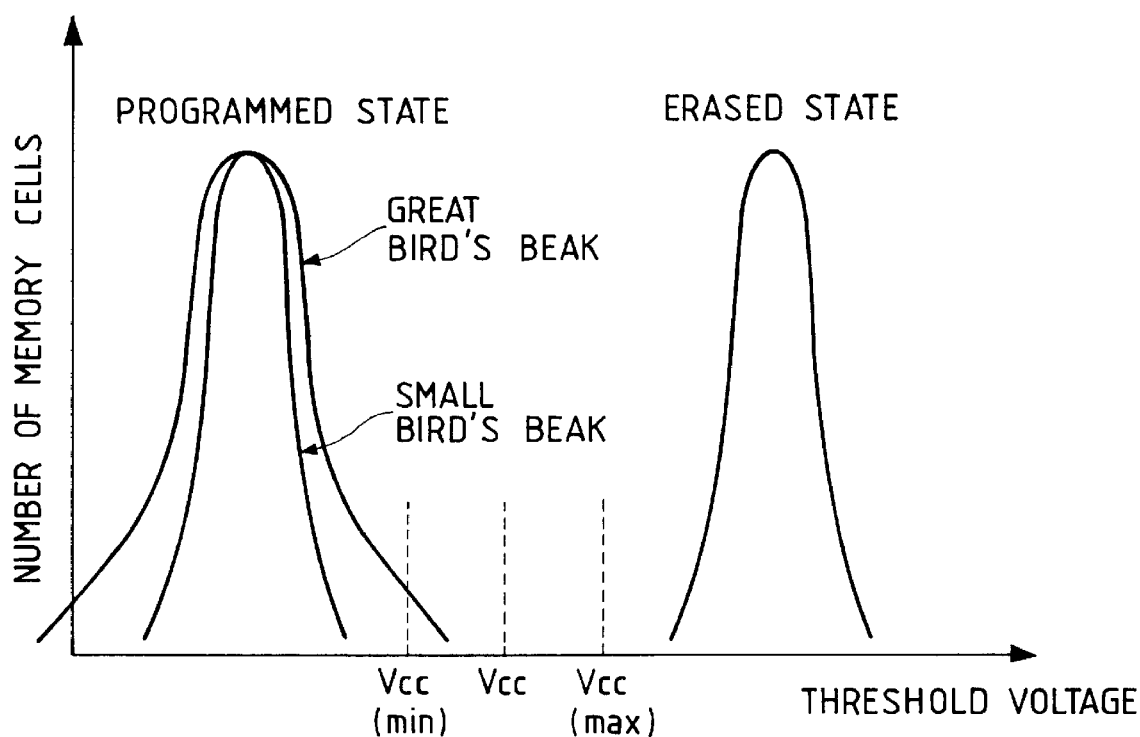
FIG. 25 is a characteristic diagram showing fluctuation of the threshold voltage of a conventional nonvolatile memory cell.

The fluctuation of the threshold voltage after programming corresponding to FIG. 23 and FIGS. 24(a) and 24(b) is shown by (b) in FIG. 13. In FIG. 13, the x axis is marked with the degree of fluctuation of the bird's beak front-end dimension and the y axis is marked with the degree of fluctuation of the threshold voltage after programming. The effective channel length of the nonvolatile memory cell Q is 0.3 nm, the threshold voltage measured at the control gate electrode G2 is 1.5 V, and the punch-through withstand voltage is 8 V.

The data is written in the nonvolatile memory cell Q by applying a reference voltage of −4 V to the p-type semiconductor substrate 1, applying an operating potential (a programming voltage pulse) with a pulse width of 0.5 ms and a voltage of 12 V to the control gate electrode G2, and injecting a tunnel current into the charge storage gate electrode G1. The threshold voltage after data is written rises to 6 V. Moreover, the data is erased by applying an operating potential of −9 V to the control gate electrode G2, applying an operating potential (an erasing voltage pulse) with a pulse width of 0.5 ms and a voltage of 5 V to the drain region, and causing the tunnel current to flow into the drain region from the charge storage gate electrode G1. The threshold voltage after the data is erased lowers to 1 V. As a result of performing tests of the programming and erasing operations using a semiconductor integrated circuit device having a storage capacity of 1 Mbit, it is possible to control the fluctuations of programming-erasing voltages for obtaining a certain threshold-voltage shift to approx. 0.02 V.

As described above, the following functions and advantages can be obtained from this embodiment.

(1) A method for fabricating a semiconductor integrated circuit device comprising a nonvolatile memory cell Q in which a charge storage gate electrode G1 is formed on the surface of an active region of a p-type semiconductor substrate 1 through a first gate insulating film 3 and a control gate electrode G2 is formed on the surface of the charge storage gate electrode G1 through a second gate insulating film 13, comprises the step of forming a first gate material 8 which is made of a polycrystalline silicon film with an impurity concentration of $1 \times 10^{19}$ atoms/cm$^3$ or lower, whose top surface is covered with an oxidation-resistant mask 5, and whose width, in the gate-length direction is prescribed on part of the surface of the first gate insulating film 3, the step of forming a thermal-oxidation insulating film 10 on the surface of the active region of the p-type semiconductor substrate 1 through thermal oxidation, the step of removing the oxidation-resistant mask 5, the step of forming a second gate material 11 which is made of a polycrystalline silicon film with an impurity concentration of $1 \times 10^{19}$ atoms/cm$^3$ or higher and whose width, in the gate-lenght direction is prescribed on each surface of the thermal-oxidation insulating film 10 and the first gate material 8, the step of forming a second gate insulating film 13 on the surface of the second gate material 11, and the step of forming a third gate material on the surface of the second gate insulating film 13.

Thereby, when forming the thermal-oxidation insulating film 10 on the surface of the active region of the p-type semiconductor substrate 1 through thermal oxidation, the growth rate of the thermal-oxidation insulating film formed on each side wall, in the gate-length direction, of the first gate material 8 made of the polycrystalline silicon film with an impurity concentration of $1 \times 10^{19}$ atoms/cm$^3$ or lower is lower than that of the thermal-oxidation insulating film formed on the side wall, in the gate-length direction, of a first gate material made of a polycrystalline silicon film with an impurity concentration of $1 \times 10^{19}$ atoms/cm$^3$ or higher. Therefore, it is possible to improve the dimensional accuracy of width, in the gate-length direction, of the first gate material 8 and moreover improve the dimensional accuracy of the gate length of the charge storage gate electrode G1 prescribed by the width, in the gate-length direction, of the first gate material. As a result, it is possible to decrease the fluctuation of size of the overlapped region where the charge storage gate electrode G1 and a drain region overlap, and moreover to decrease the fluctuation of the size of the overlapped region where the charge storage gate electrode and the source region overlap. Therefore, it is possible to uniform the programming and erasing characteristics of the nonvolatile memory cell Q.

Moreover, when forming the thermal-oxidation insulating film 10 on the surface of the active region of the p-type semiconductor substrate 1 through thermal oxidation, the fluctuation of the gate bird's beak (thermal-oxidation insulating film) grown from the side wall in the gate-length direction, of the first gate material 8 made of a polycrystalline silicon film with an impurity concentration of $1 \times 10^{19}$ atoms/cm$^3$ or lower toward the central portion of the material 8 between the first gate material 8 and the p-type semiconductor substrate 1 is smaller (by 5 nm or less) than that of gate bird's beak grown from the side wall, in the gate-length direction, of a first gate material 1 made of a polycrystalline silicon film with an impurity concentration of $1 \times 10^{19}$ atoms/cm$^3$ or higher toward the central portion of the first gate material between the first gate material and a semiconductor substrate. Therefore, it is possible to decrease the fluctuation of the threshold voltage after programming of a nonvolatile memory cell Qm for which the programming and erasing operations are performed by the tunnel effect. As a result, it is possible to increase the operational margin of the nonvolatile memory cell Q against the fluctuation of power-source potential.

Moreover, because nonvolatile memory cells Q with uniform characteristics over semiconductor chips or semiconductor wafers can be fabricated, it is possible to stably fabricate semiconductor integrated circuit devices with a high reliability and a large strorage capacity.

(2) By including the step of forming the thermal-oxidation insulating film 2 on the surface of the inactive region of the p-type semiconductor substrate 1 before the step of forming the first gate insulating film 3, it is possible to set the thickness of the thermal-oxidation insulating film 10 formed on the surface of the active region of the p-type semiconductor substrate 1 to a value smaller than that of the thermal-oxidation insulating film 2 formed on the surface of the inactive region of the p-type semiconductor substrate 1 but larger than that of the first gate insulating film 3. Thereby, it is possible to decrease the diffusion length over which impurities introduced in self-alignment with the oxidation-resistant mask 5 into the channel-forming-region side under the first gate material 8 are diffused because the heat treatment time taken to form the thermal-oxidation insulating film 10 on the surface of the active region of the p-type semiconductor substrate 1 is shorter than that taken to form the thermal-oxidation insulating film 2 on the surface of the inactive region of the p-type semiconductor substrate 1. As a result, because an effective channel length can be ensured between the source and drain regions and thereby, it is possible to raise the punch-through withstand voltage of the nonvolatile memory cell Q.

(3) The step of forming the side wall spacer 16 on the side wall of the first gate material 8 is included after the step of forming the first gate material 8 and before the step of forming the thermal-oxidation insulating film 10. Thereby, it is possible to further improve the dimensional accuracy of the width, in the gate-length direction, of the first gate material 8 because the growth rate of the thermal-oxidation insulating film formed on each side, in the gate-length direction, of the first gate material 8 is lower than that of the thermal-oxidation insulating film formed on each side, in the gate-length direction, of the first gate material not covered with the side wall spacer 16. As a result, it is possible to further decrease the fluctuation of the size of the overlapped region where the charge storage gate electrode G1 and the drain region overlap, and moreover, the fluctuation of the size of the overlapped region where the charge storage gate electrode and the source region overlap. Therefore, it is possible to further uniform the programming and erasing characteristics of a nonvolatile memory cell Q.

(4) In a semiconductor integrated circuit device comprising a nonvolatile memory cell Q in which a charge storage gate electrode G1 is formed on the surface of an active region of a p-type semiconductor substrate 1 through a first gate insulating film 3, a control gate electrode G2 is formed on the surface of the charge storage gate electrode G1 through a second gate insulating film 13, and source and drain regions are formed on the surface of the active region of the p-type semiconductor substrate 1 in self-alignment with the charge storage gate electrode G1, the fluctuation of the thermal-oxidation insulating film grown from the side wall, in the gate-length direction, of the charge storage gate electrode G1 toward the central portion of the charge storage gate electrode G1 between the charge storage gate electrode G1 and the p-type semiconductor substrate 1 is set to 5 nm or less. Because the fluctuation of the threshold voltage after programming can be suppresssed by the above structure, it is possible to increase the operational margin of the non-volatile memory cell Q against the fluctuation of the power source potential.

In the step before the step of forming the second gate material 11, it is also possible to use an amorphous silicon film (a-Si) with an impurity concentration of $1\times10^{19}$ atoms/cm$^3$ or lower for the first gate material 8. In this case, the same advantage is obtained as in the case where a polycrystalline silicon film with an impurity concentration of $1\times10^{19}$ atoms/cm$^3$ is used for the first gate material 8. It is possible to form the amorphous silicon film by depositing a non-doped silicon film.

(Embodiment 2)

Figure 14:
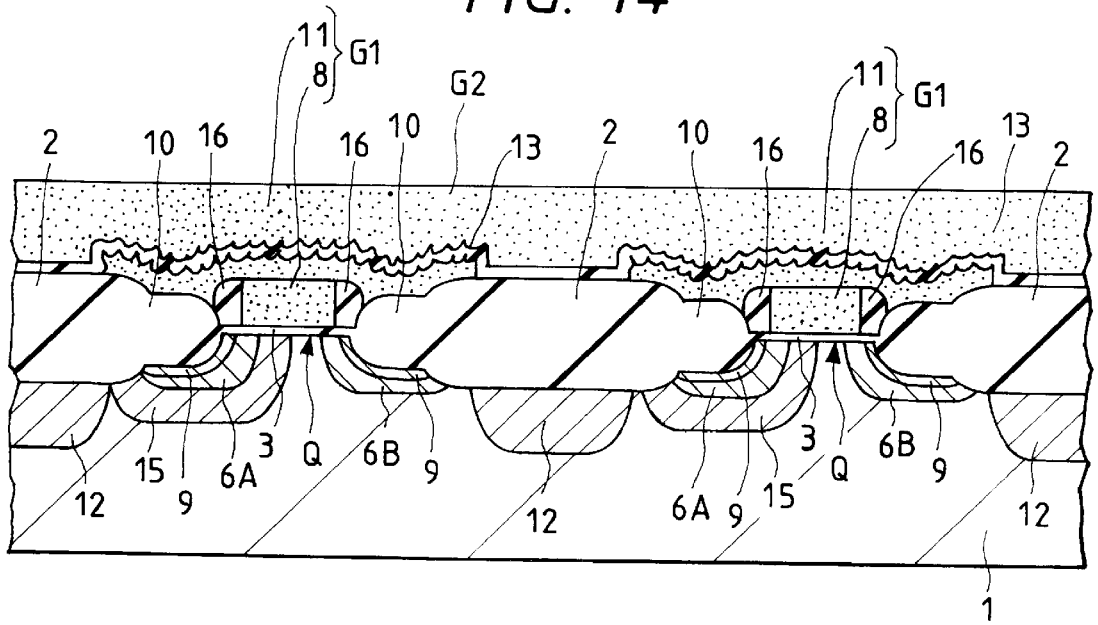
FIG. 14 is a sectional view of a principal part of the semiconductor integrated circuit device of embodiment 2 of the present invention.

A schematic structure of the semiconductor integrated circuit device of embodiment 2 of the present invention comprising a nonvolatile memory cell is shown in FIG. 14 (sectional view of a principal part).

As shown in FIG. 14, the semiconductor integrated circuit device has a nonvolatile memory cell Q for which performing the programming and erasing operations are performed by the tunnel effect. The nonvolatile memory cell Q mainly consists of a p-type semiconductor substrate 1 serving as a channel forming region, a first gate insulating film 3, a charge storage gate electrode (flowing gate electrode) G1, a second gate insulating film 13, a control gate electrode G2, an n-type semiconductor region 6A serving as a source region, an n-type semiconductor region 6B serving as a drain region, a pair of n$^+$-type semiconductor regions 9 serving as a source region and a drain region respectively, and a p-type semiconductor region 15 serving as a threshold-voltage control region.

The charge storage gate electrode G1, similarly to the above-described embodiment 1, comprises a first gate material 8 and a second gate material 11 superimposed on the first gate material 8. The second gate material 11 is made of a polycrystalline silicon film containing phosphorus as impurities for decreasing a resistance value.

The surface of the second gate material 11 is irregular. The irregularity of the surface of the second gate material 11 is formed by dipping the p-type semiconductor substrate 1 in a phosphoric acid solution before the step of forming the second gate insulating film 13. The step of dipping the p-type semiconductor substrate 1 in the phosphoric acid solution is performed under the condition of that the temperature of the phosphoric acid solution(H$_3$PO$_4$) is approx. 140° to 160° C., and the dipping time is approx. 60 min.

Therefore, because the surface of the second gate material 11 can be made irregular by using a polycrystalline silicon film containing phosphorus for the second gate material 11 and including the step of dipping the semiconductor substrate 1 in the phosphoric acid solution after the step of forming the second gate material 11 and before the step of forming the second gate insulating film 13, it is possible to increase the surface area of the charge storage gate electrode G1 and thereby, increase the storage amount of charge of a nonvolatile memory cell Q.

It is also possible to form the irregularity of the surface of the second gate material 11 by depositing hemispherical grains (HSG) by a CVD method.

(Embodiment 3)

Figure 15:
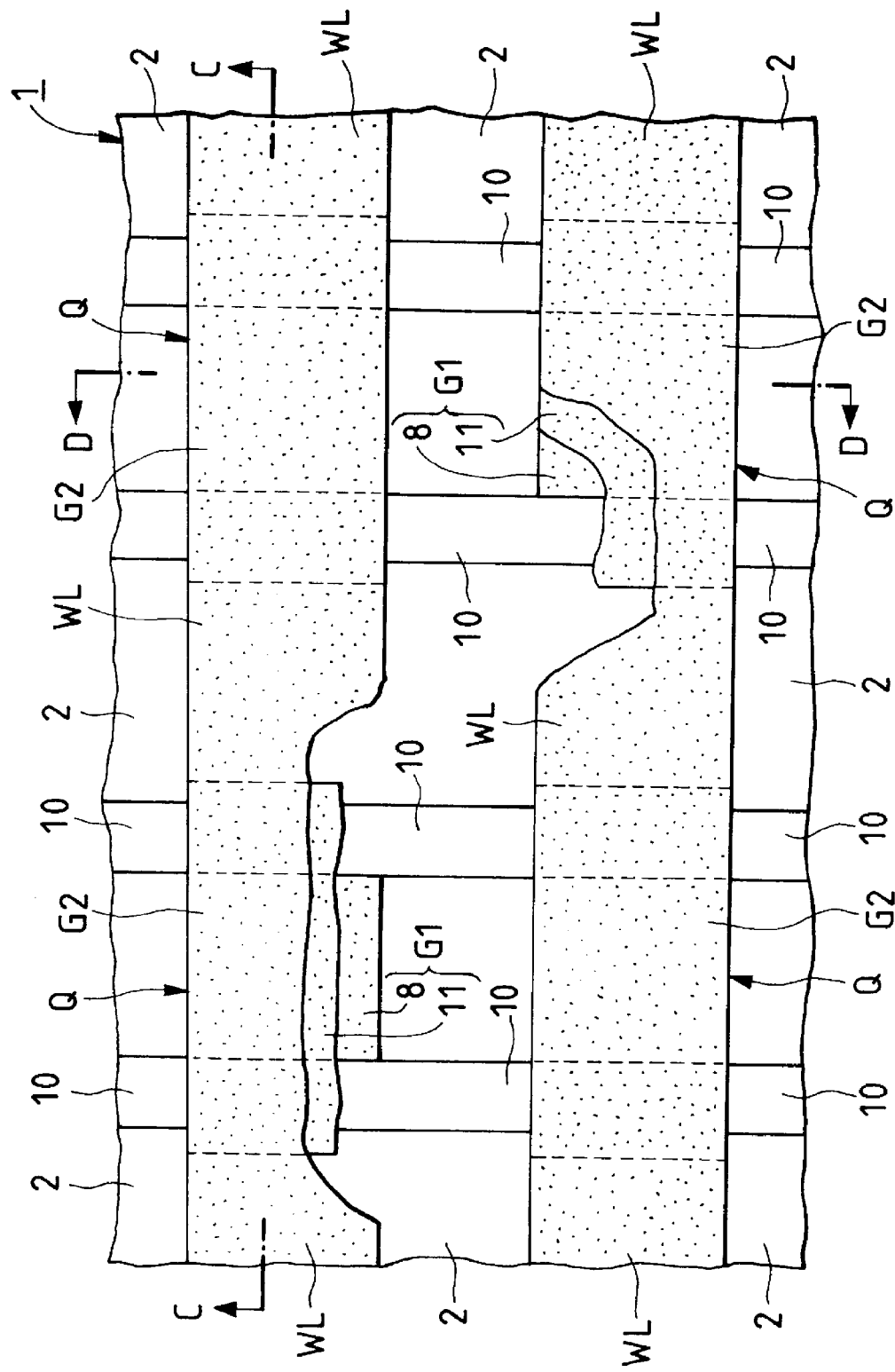
FIG. 15 is a top view of a principal part of the semiconductor integrated circuit device of embodiment 3 of the present invention.
Figure 16:
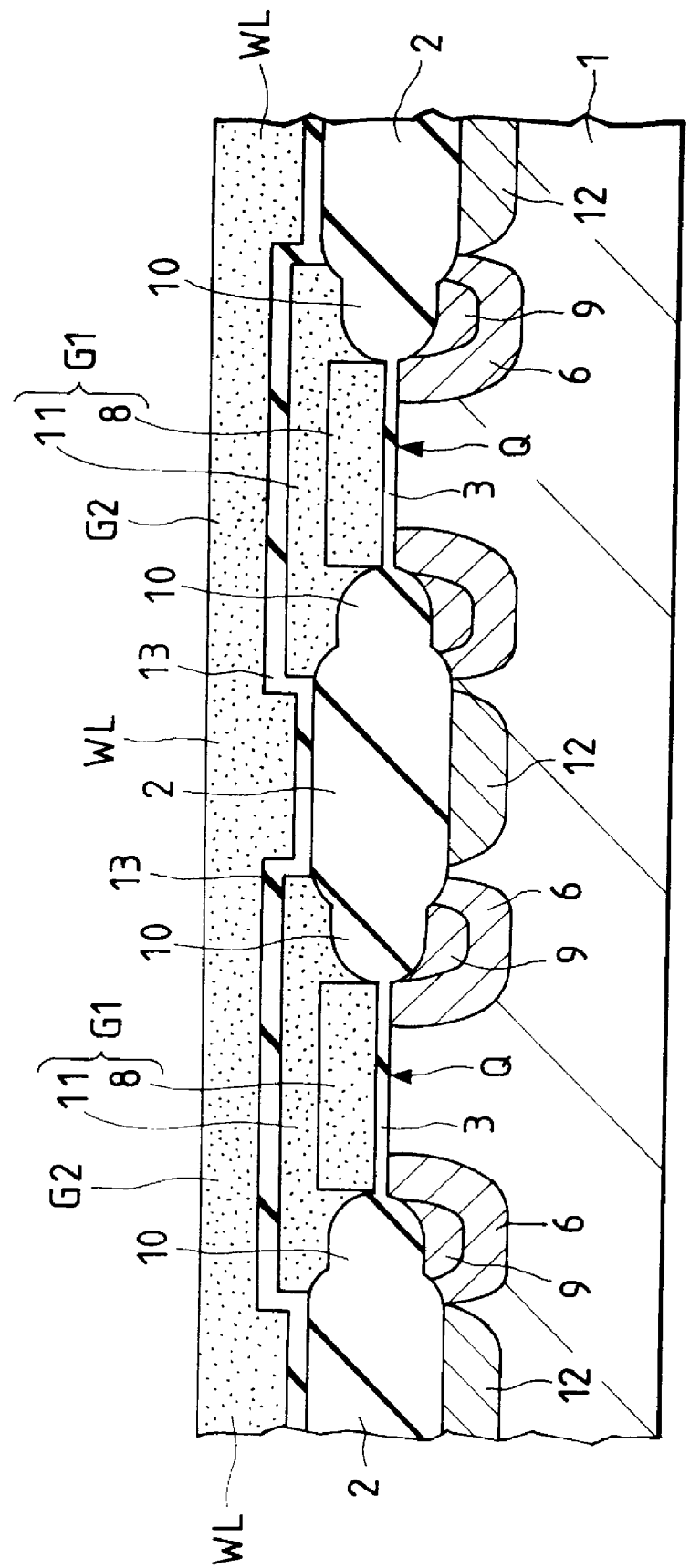
FIG. 16 is a sectional view of a principal part of the semiconductor integrated circuit device of FIG. 15, taken along the line C—C in FIG. 15.
Figure 17:
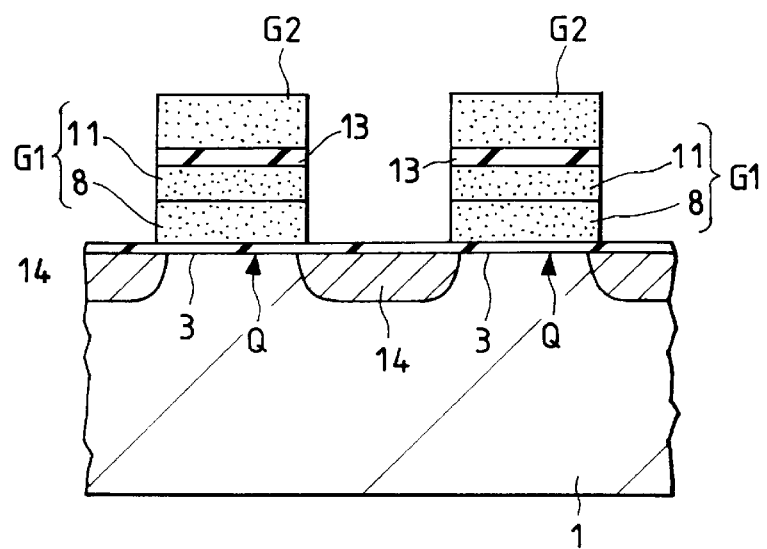
FIG. 17 is a sectional view of a principal part of the semiconductor integrated circuit device of FIG. 15, taken along the line D—D in FIG. 15.

A schematic structure of the semiconductor integrated circuit device of embodiment 3 of the present invention is shown n FIG. 15 (top view of a principal part), FIG. 16 (sectional view of the principal part of FIG. 15, taken along the line C—C of FIG. 15), and FIG. 17 (sectional view of the principal part of FIG. 15, taken along the line D—D of FIG. 15).

As shown in FIG. 15, the semiconductor integrated circuit device has a plurality of nonvolatile memory cells Q in a memory cell forming region of a p-type semiconductor substrate 1 made of, for example, single-crystal silicon. A plurality of nonvolatile memory cells Q are arranged in the extending direction of word lines WL extending in the gate-length direction (X direction) and in the extending direction of data lines (not illustrated) extending in the gate-width direction (Y direction). That is, each of the nonvolatile memory cells Q is provided in the region where a word line WL extending in the gate-length direction intersects the data line extending in the gate-width direction.

Each nonvolatile memory cell Q is constituted on the surface of an active region of a p-type semiconductor substrate 1 as shown in FIG. 16. The nonvolatile memory cell Q mainly consists of a p-type semiconductor substrate (channel forming region) 1, a first gate insulating film 3, a charge storage gate electrode (floating gate electrode) G1, a second gate insulating film 13, a control gate electrode G2, a pair of n-type semiconductor regions 6 serving as a source region and a drain region respectively, and a pair of n$^+$-type semiconductor regions 9. That is, the nonvolatile memory cell Q comprises an n-channel conductivity-type field effect transistor.

The first gate insulating film 3 is made of, for example, a silicon oxide film with a thickness of approx. 8 nm. The second gate insulating film 13 is made of a multilayerfilm formed by superposing, for example, a first silicon-oxide film, a silicon nitride film, and a second silicon-oxide film in order. The thickness of the first silicon-oxide film is set to, say, approx. 5 nm, that of the silicon nitride film is set to, say, approx. 10 nm, and that of the second silicon-oxide film is set to, say, approx. 4 nm.

The charge storage gate electrode G1 is made of a first gate material 8 and a second gate material 11 superimposed on the surface of the first gate material 8. The second gate material 11 comprises a polycrystalline silicon film containing impurities (e.g., phosphorus) for decreasing a resistance value. The thickness of the polycrystalline silicon film is set to, e.g., approx. 100 nm and the impurity concentration of the film is set to approx. $3.5\times10^{20}$ atoms/cm$^3$. The impurities are introduced into the polycrystalline silicon film while or after the film is deposited. The first gate material 8 comprises a polycrystalline silicon film containing impurities (e.g., phosphorus) for decreasing a resistance value. The thickness of the polycrystalline silicon film is set to, e.g., approx. 50 nm and the impurity concentration of the film is set to approx. $2.5\times10^{20}$ atoms/cm$^3$. The impurities are introduced into the polycrystalline silicon film from the polycrystalline silicon film of the second gate material 11 by means of thermal diffusion (drive-in diffusion). That is, the first gate material 8 is doped through impurity diffusion from the second gate material 11.

The width, in the gate-length direction, of the first gate material 8 prescribes the gate length of the charge storage gate electrode G1. The width, in the gate-length direction, of the first gate material 8 is set to, e.g., approx. 0.5 μm. That is, the gate length of the charge storage gate electrode G1 is set to 0.5 μm.

The control gate electrode G2 is made of a polycrystalline silicon film containing impurities for decreasing a resistance value. The thickness of the polycrystalline silicon film is set to, for example, approx. 200 nm and the impurity concentration of the film is set to approx. $3.5 \times 10^{20}$ atoms/cm$^3$.

Each of the n-type semiconductor regions 6 serving as a source region and a drain region respectively is formed on the surface of the active region of the p-type semiconductor substrate 1 between the thermal-oxidation insulating film 2 and the first gate material 8 and the impurity concentration of the region is set to, for example, approx. $5 \times 10^{19}$ atoms/cm$^3$. Each of the n$^+$-type semiconductor regions 9 serving as a source region and a drain region respectively is formed on each surface of the n-type semiconductor regions 6 and the impurity concentration of the region is set to, for example, approx. $7 \times 10^{20}$ atoms/cm$^3$. That is, the impurity concentration of each of the n$^+$-type semiconductor regions 9 is set to a value higher than that of each of the n-type semiconductor regions 6, and the nonvolatile memory cell Q comprises an LDD (Lightly Doped Drain) structure in which the impurity concentration of part of the drain region on the channel forming region side is set to a value lower than that of the other regions.

The width, in the gate-length direction, of the active region of the p-type semiconductor substrate 1 is prescribed by a pair of thermal-oxidation insulating films 2 formed on the surface of the inactive region of the p-type semiconductor substrate 1. Each of the thermal-oxidation insulating films 2 comprises a silicon oxide film formed by a known selective oxidation method and its thickness is set to, e.g., approx. 500 nm. Each of the thermal-oxidation insulating films 2 extends in the gate-width direction and electrically isolates the nonvolatile memory cells Q arranged in the extending direction of the word line WL from each other. That is, the thermal-oxidation insulating film 2 is used as an element isolating film for isolating elements from each other.

A p-type semiconductor region 12 serving as a channel stopper region is formed under the thermal-oxidation insulating film 2. The impurity concentration of the p-type semiconductor region 12 is set to, e.g., approx. $4 \times 10^{17}$ atoms/cm$^3$.

Each of the n-type semiconductor regions 6 serving as a source region and a drain region respectively is continuously formed in the gate-width direction. Moreover, each of the n$^+$-type semiconductor regions 9 serving as a source region and a drain region respectively is continuously formed in the gate-width direction. That is, the source and drain regions of a nonvolatile memory cell Q are electrically connected to the respective source and drain regions of other nonvolatile memory cell Q arranged in the gate-width direction.

One of the n-type semiconductor regions 6, serving as a source region, and one of the n$^+$-type semiconductor regions 9, serving as a source region, are used as a local source line (LSI). The other of the n-type semiconductor regions 6, serving as a drain, region, and the other of the n$^+$-type semiconductor regions 9, serving as a drain region, are used as a local data line (LDL). That is, the semiconductor integrated circuit device of this embodiment has a structure in which the local data line (LDL) is buried in the p-type semiconductor substrate 1, and comprises an AND-type flash memory.

A pair of thermal-oxidation insulating films 10 are formed on each surface of the p-type semiconductor substrate 1 between the thermal-oxidation insulating film 2 and the first gate material 8. Each of the thermal-oxidation insulating films 10 is formed on each surface of the n-type semiconductor regions 6 and the n$^+$-type semiconductor regions 9. Moreover, each of the thermal-oxidation insulating films 10 extends in the gate-width direction. Furthermore, each of the thermal-oxidation insulating films 10 is formed by a thermal oxidation method and its thickness is set to, e.g., approx. 150 nm.

The second gate material 11 of the charge storage gate electrode G1 is formed on the surface of the first gate material 8 and that of the thermal-oxidation insulating film 10. That is, the width, in the gate-length direction, of the second gate material 11 is larger than that of the first gate material 8 prescribing the gate length of the charge storage gate electrode G1. Thus, by making the width, in the gate-length direction, of the second gate material 11 larger than that of the first gate material 8, it is possible to increase the area of the charge storage gate electrode G1 without increasing the gate length of the charge storage gate electrode G1. Therefore, it is possible to increase the operation speed of a nonvolatile memory cell Q and moreover increase the storage amount of charges of the nonvolatile memory cell Q.

The control gate electrode G2 of the nonvolatile memory cell Q is integrated with the word line WL extending in the gate-length direction and electrically connects to the control gate electrode G2 of other nonvolatile memory cells Q. The control gate electrode G2 and the word line WL comprise, for example, polycrystalline silicon films. Impurities for decreasing a resistance value are introduced into the polycrystalline silicon film while or after the polycrystalline silicon film is deposited.

As shown in FIG. 17, a p-type semiconductor region 14 serving as a channel stopper region is formed on the surface of the p-type semiconductor substrate 1 between the nonvolatile memory cells Q arranged in the gate-width direction.

Next, a method for fabricating a semiconductor integrated circuit device comprising the nonvolatile memory cell Q will be described below referring to FIGS. 18 to 20 (sectional views for explaining the fabrication method).

First, a p-type semiconductor substrate 1 is prepared. The resistivity value of the p-type semiconductor substrate 1 is set to, e.g., approx. 10 Ωcm.

Then, a pair of thermal-oxidation insulating films 2 are formed on the surface of the inactive region of the p-type semiconductor substrate 1. Each of the thermal-oxidation insulating films 2 comprises a silicon oxide film formed by, for example, a known selective oxidation method, and extends in the gate-width direction (Y direction). Moreover, each of the thermal-oxidation insulating films 2 prescribes the (X-directional) width, in the gate-length direction, of the active region of the p-type semiconductor substrate 1.

Then, a first gate insulating film 3 is formed on the surface of the active region of the p-type semiconductor substrate 1 prescribed by the thermal-oxidation insulating film 2. The first gate insulating film 3 comprises a silicon oxide film formed by, for example, a thermal oxidation method.

Then, a polycrystalline silicon film with an impurity concentration of $1 \times 10^{19}$ atoms/cm$^3$ or lower is formed on the whole surface of a substrate including each surface of the thermal-oxidation insulating film 2 and the first gate insulating film 3. The polycrystalline silicon film 4 is formed by, for example, a CVD method.

Then, an oxidation-resistant mask 5 extending in the gate-width direction is formed on part of the surface of the polycrystalline silicon film 4 on the first gate insulating film 3. The oxidation-resistant mask 5 comprises, for example, a silicon nitride film.

Figure 18:
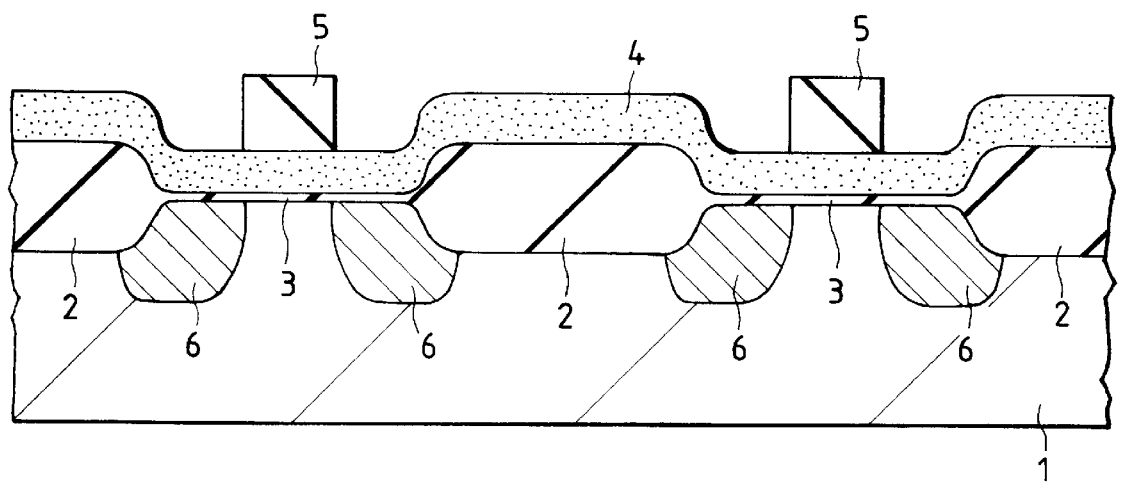
FIG. 18 is a sectional view of a principal part of the semiconductor integrated circuit device, for explaining how to fabricate the semiconductor integrated circuit device.

Then, n-type impurities (e.g. phosphorus) are introduced into the surface of the active region of the p-type semiconductor substrate 1 in self-alignment with the thermal-oxidation insulating film 2 and the oxidation-resistant mask 5 to form a pair of n-type semiconductor regions 6 serving as a source region and a drain region respectively as shown in FIG. 18. Each of the n-type semiconductor regions 6 extends in the gate-width direction. The n-type impurities are introduced into the surface by, for example, an ion implantation method.

Then, an oxidation-resistant mask 7 comprising, for example, a silicon nitride film is formed on the side walls, in the gate-length direction, facing to each other of the oxidation-resistant mask 5. The oxidation-resistant mask 7 is formed by forming a silicon nitride film on the whole surface of the polycrystalline silicon film 4 including the surface of the oxidation-resistant mask 5 by, for example, a CVD method, and thereafter, anisotropically etching the silicon nitride film.

Then, the polycrystalline silicon film 4 is patterned to form a first gate material 8 which is comprises the polycrystalline silicon film 4 with an impurity concentration of $1 \times 10^{19}$ atoms/cm$^3$ or lower, whose top surface is covered with the oxidation-resistant masks 5 and 7, and whose width in the gate-length direction is prescribed, on part of the surface of the first gate insulating film 3. The polycrystalline silicon film 4 is patterned by, for example, anisotropic etching. The first gate material 8 extends in the gate-width direction.

Figure 19:
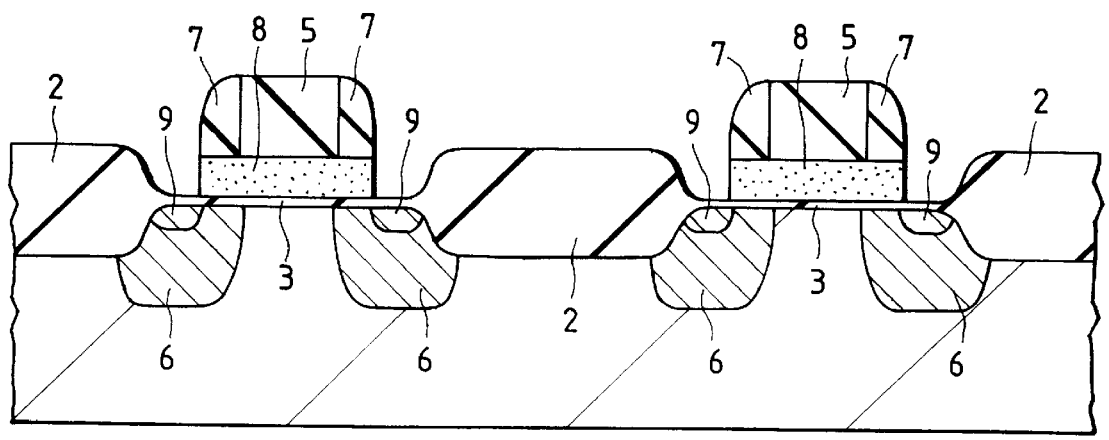
FIG. 19 is a sectional view of a principal part of the semiconductor integrated circuit device, for explaining how to fabricate the semiconductor integrated circuit device.

Then, n-type impurities (e.g., phosphorus) are introduced into the surface of the p-type semiconductor substrate 1 between the thermal-oxidation insulating film 2 and the first gate material 8 in self-alignment with the thermal-oxidation insulating film 2 and the first gate material 8 to form a pair of n$^+$-type semiconductor regions 9 serving as a source region and a drain region respectively as shown in FIG. 19. Each of the paired n$^+$-type semiconductor regions 9 is substantially formed on each surface of the n-type semiconductor regions 6, and extends in the gate-width direction. Moreover, the impurity concentration of each of the n$^+$-type semiconductor regions 9 is set to a value larger than that of each of the n-type semiconductor regions 6.

Then, a pair of thermal-oxidation insulating films 10 are formed through thermal oxidation on each surface of the n$^+$-type semiconductor regions 9 serving as a source region and a drain region respectively and the n-type semiconductor regions 6, on the surface of the p-type semiconductor substrate 1 between the thermal-oxidation insulating film 2 and the first gate material 8. The thickness of each of the paired thermal-oxidation insulating films 10 is set to a value smaller than that of the thermal-oxidation insulating film 2 but larger than that of the first gate insulating film 3. The thermal oxidation is performed in water vapor in an oxidation temperature region in which the surface reaction strongly tends to control the degree of oxidation of the p-type semiconductor substrate 1.

In this step, a thermal-oxidation insulating film is also formed on each side, in the gate-length direction, of the first gate material 8. However, because the first gate material 8 comprises a polycrystalline silicon film with an impurity concentration of $1 \times 10^9$ atoms/cm$^3$ or lower, the growth rate of the thermal-oxidation insulating film formed on each side, in the gate-length direction, of the first gate material 8 is lower than that of a thermal-oxidation insulating film formed on each side, in the gate-length direction, of a first gate material made of a polycrystalline silicon film with an impurity concentration of $1 \times 10^{20}$ atoms/cm$^3$ or higher. The reason why the growth rate of the thermal-oxidation insulating film is low is that the impurity concentration does not increase the growth rate.

Moreover, a gate bird's beak (thermal-oxidation insulating film) grown from side wall, in the gate-length direction, of the first gate material 8 toward the central portion of the material 8 is formed between the first gate material 8 and the p-type semiconductor substrate 1. However, because the first gate material 8 comprises a polycrystalline silicon film with an impurity concentration of $1 \times 10^{19}$ atoms/cm$^3$ or lower, the fluctuation of the gate bird's beak (thermal-oxidation insulating film) grown from the side wall, in the gate-length direction, of the first gate material 8 toward the central portion of the material 8 between the first gate material 8 and the p-type semiconductor substrate 1 is smaller than that of the gate bird's beak grown from the side wall, in the gate-length direction, of a first gate material comprising a polycrystalline silicon film with an impurity concentration of $1 \times 10^{20}$ atoms/cm$^3$ or higher toward the central portion of the first material between the first material and the semiconductor substrate. The reason why the fluctualtin of the gate bird's beak is small is that the impurity concentration does not increase the speed.

Moreover, because the thickness of the thermal-oxidation insulating film 10 is set to a value smaller than that of the thermal-oxidation insulating film 2 formed by a selective oxidation method, the heat treatment time required to form the thermal-oxidation insulating film 10 is shorter than that required to form the thermal-oxidation insulating film 2.

Then, the masks 5 and 7 are removed.

Then, a polycrystalline silicon film is formed on the whole surface of the p-type semiconductor substrate 1 including each surface of the thermal-oxidation insulating film 10 and the first gate material 8 by, for example, a CVD method. Impurities (e.g. phosphorus) for decreasing a resistance value are introduced into the polycrystalline silicon film while the polycrystalline silicon film is deposited.

Then, a mask 20 whose width in the gate-length direction is prescribed is formed on the surface of the oxidation insulating film 10 and part of the surface of the polycrystalline silicon film on the gate material 8. The mask 20 comprises, for example, a photoresist film and extends in the gate-width direction.

Figure 20:
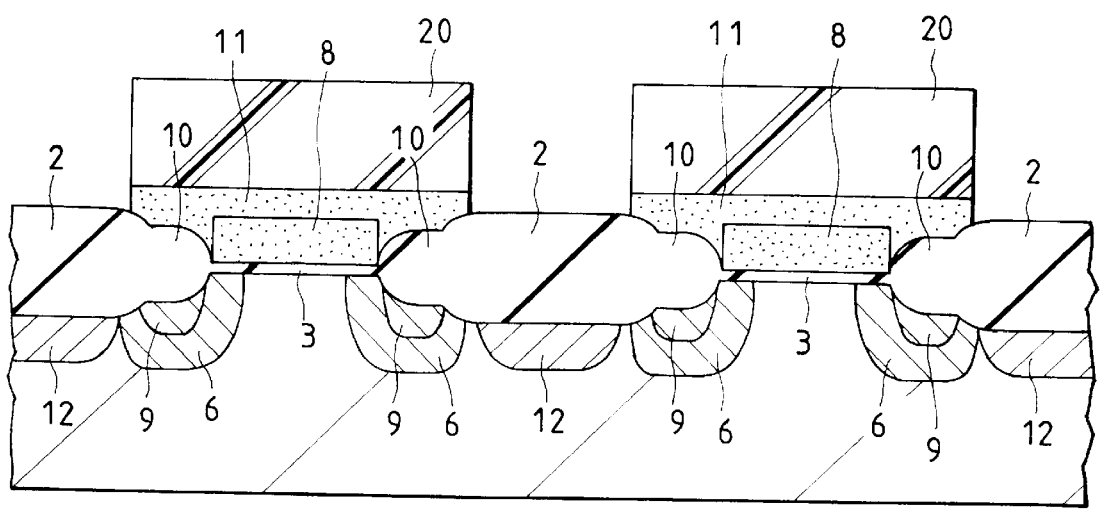
FIG. 20 is a sectional view of a principal part of the semiconductor integrated circuit device, for explaining how to fabricate the semiconductor integrated circuit device.

Then, the polycrystalline silicon film is patterned and, as shown in FIG. 20, a second gate material 11 which comprises a polycrystalline silicon film containing impurities and whose width, in the gate-length direction is prescribed is formed on each surface of the oxidation insulating film 10 and the first gate material 8.

Then, p-type impurities are introduced into the surface of the p-type semiconductor substrate 1 under the field insulating film 2 by, for example, the ion implantation method in self-alignment with the mask 20 to form a p-type semiconductor region 12 serving as a channel stopper region.

Then, the mask 20 is removed.

Then, thermal diffusion is performed to diffuse the impurities introduced into the second gate material 11 into the first gate material 8. The thermal diffusion is performed in an atmosphere at a temperature of approx. 850° C. for approx. 10 min. In this step, the resistance value of the first gate material 8 is decreased by the impurities introduced from the second gate material 11 by means of diffusion.

Then, a second gate insulating film 13 is formed on the surface of the second gate material 11. The second gate insulating film 13 comprises a multilayer film obtained by superimposing a first silicon oxide film, a silicon nitride film, and a second silicon oxide film in order by, for example, a CVD method.

Then, a third gate material is formed on the surface of the second gate insulating film 13. The third gate material comprises, for example, a polycrystalline silicon film containing impurities (e.g., phosphorous) for decreasing a resistance value.

Then, patterning for prescribing the width in the gate-length direction in the active region is applied to the third gate material and patterning for prescribing width in the gate-width-direction in the inactive region is applied to the second gate material 11 and the first gate material 8, in order to form a control gate electrode G2 and a word line (WL) with the third gate material, and moreover to form a charge storage gate electrode G1 with the second gate material 11 and the first gate material 8 respectively. At this step, a nonvolatile memory cell Q is almost completed.

Then, p-type impurities are introduced into the surface of the p-type semiconductor substrate 1 between the above nonvolatile memory cell Q and an other nonvolatile memory cell Q arranged in the gate-width direction in self-alignment with these control gate electrodes 13 to form a p-type semiconductor region 14 used as a channel stopper region. In this step, channel forming regions of a plurality of nonvolatile memory cells Q arranged in the gate-width direction are isolated from each other by the p-type semiconductor region 14.

It is also possible to include a step of introducing impurities (e.g. phosphorus) into the polycrystalline silicon film after the step of forming the polycrystalline silicon film on the whole surface of the p-type semiconductor substrate 1 including each surface of the thermal-oxidation insulating film 10 and the first gate material 8 by, for example, a CVD method and before the step of forming the mask 20.

The constitution of the nonvolatile memory cell Q, similarly to the embodiments 1 to 3, makes it possible to decrease the fluctuation of the gate bird's beak grown from side wall, in the gate-length direction, of the first gate material 8 toward the central portion of the material 8 between the first gate material 8 and the p-type semiconductor substrate 1 to 5 nm or less as shown in FIG. 12(a) (photograph taken by an electron microscope showing a grown state of the gate bird's beak) and FIG. 12(b). The decrease of the fluctuation of gate bird's beak suppresses the fluctuation of the threshold voltage after programming as shown by (a) in FIG. 13 (correlation diagram showing the relation between the fluctuation of gate bird's beak and the fluctuation of the threshold voltage after programming).

The effective channel length of the nonvolatile memory cell Q is 0.3 nm, the threshold voltage measured at the control gate electrode G2 is 1.5 V, and the punch-through withstand voltage is 8 V.

The data is written in the nonvolatile memory cell Q by applying a reference voltage of −4 V to the p-type semiconductor substrate 1, applying an operating potential (a programming voltage pulse) with a pulse width of 0.5 ms and a voltage of 12 V to the control gate electrode G2, and injecting a tunnel current into the charge storage gate electrode G1. The threshold voltage after data is written rises to 6 V. Moreover, data is erased by applying an operating potential of −9 V to the control gate electrode G2, applying an operating potential (an erasing voltage pulse) with a pulse width of 0.5 ms and a voltage of 5 V to the drain region, and causing the tunnel current into the drain region from the charge storage gate electrode G1. The threshold voltage after the data is erased lowers to 1 V. As a result of performing tests of the programming and erasing operations with a semiconductor integrated circuit device having a storage capacity of 1 Mbit, it is possible to control the fluctuation of programming-erasing voltage for obtaining a certain threshold-voltage shift to approx. 0.02 V.

As described above, the following functions and advantages can be obtained from this embodiment.

(1) A method for fabricating a semiconductor integrated circuit device comprising a nonvolatile memory cell Q in which a charge storage gate electrode G1 is formed on the surface of an active region of a p-type semiconductor substrate 1 through a first gate insulating film 3 and a control gate electrode G2 is formed on the surface of the charge storage gate electrode G1 through a second gate insulating film 13, comprises the step of forming a first gate material 8 which comprises a polycrystalline silicon film with an impurity concentration of $1 \times 10^{19}$ atoms/cm$^3$ or lower, whose top surface is covered with an oxidation-resistant mask 5, and whose width, in the gate-length direction, is prescribed on part of the surface of the first gate insulating film 3, the step of forming a thermal-oxidation insulating film 10 on the surface of the active region of the p-type semiconductor substrate 1 through thermal oxidation, the step of removing the oxidation-resistant mask 5, the step of forming a second gate material 11, which comprises a polycrystalline silicon film with an impurity concentration of $1 \times 10^{19}$ atoms/cm$^3$ or higher and whose width, in the gate-length direction, is prescribed, on each surface of the thermal-oxidation insulating film 10 and the first gate material 8, the step of forming a second gate insulating film 13 on the surface of the second gate material 11, and the step of forming a third gate material on the surface of the second gate insulating film 13.

Thereby, when forming the thermal-oxidation insulating film 10 on the surface of the active region of the p-type semiconductor substrate 1 through thermal oxidation, the growth rate of the thermal-oxidation insulating film formed on each side wall, in the gate-length direction, of the first gate material 8 comprising the polycrystalline silicon film with an impurity concentration of $1 \times 10^{19}$ atoms/cm$^3$ or lower is lower than that of the thermal-oxidation insulating film formed on the side wall, in the gate-length direction, of the first gate material made of a polycrystalline silicon film with an impurity concentration of $1 \times 10^{20}$ atoms/cm$^3$ or higher. Therefore, it is possible to improve the dimensional accuracy of the width, in the gate-length direction, of the first gate material 8 and moreover to improve the dimensional accuracy of the gate length of the charge storage gate electrode G1 prescribed by the width, in the gate-length direction, of the first gate material. As a result, it is possible to decrease the fluctuation of the size the an overlapped region where the charge storage gate electrode G1 and the drain region overlap, and to decrease the fluctuation of the size of the overlapped region where the charge storage gate electrode and the source region overlap. Therefore, it is possible to uniform the programming and erasing characteristics of the nonvolatile memory cell Q.

Moreover, when forming the thermal-oxidation insulating film 10 on the surface of the active region of the p-type semiconductor substrate 1 through thermal oxidation, the fluctuation of the gate bird's beak (thermal-oxidation insulating film) grown from side wall, in the gate-length direction, of the first gate material 8 comprising a polycrystalline silicon film with an impurity concentration of $1 \times 10^{19}$ atoms/cm$^3$ or lower toward the central portion of the material 8 between the first gate material 8 and the p-type semiconductor substrate 1 is smaller (by 5 nm or less) than that of the gate bird's beak grown from side wall, in the gate-length direction, of the first gate material 1 comprising a polycrystalline silicon film with an impurity concentration of $1\times10^{20}$ atoms/cm$^3$ or higher toward the central portion of the first gate material between the first gate material and the semiconductor substrate. Therefore, it is possible to decrease the fluctuation of the threshold voltage after programming of a nonvolatile memory cell Qm which undergoes the programming and erasing operations by the tunnel effect. As a result, it is possible to increase the operational margin of the nonvolatile memory cell Q against the fluctuation of power-source potential.

Moreover, because a nonvolatile memory cell Q with uniform characteristics over semiconductor chips or semiconductor wafers can be fabricated, it is possible to stably fabricate a semiconductor integrated circuit device with a high reliability and a large storage capacity.

(2) By including the step of forming the thermal-oxidation insulating film 2 on the surface of the inactive region of the p-type semiconductor substrate 1 before the step of forming the first gate insulating film 3, it is possible to set the thickness of the thermal-oxidation insulating film 10 formed on the surface of the active region of the p-type semiconductor substrate 1 to a value smaller than that of the thermal-oxidation insulating film 2 formed on the surface of the inactive region of the p-type semiconductor substrate 1 but larger than that of the first gate insulating film 3. Thereby, it is possible to decrease the diffusion length over which impurities introduced in self-alignment with the oxidation-resistant mask 5 into the channel-forming-region side under the first gate material 8 is diffused because the heat treatment time required to form the thermal-oxidation insulating film 10 on the surface of the active region of the p-type semiconductor substrate 1 is shorter than the time required to form the thermal-oxidation insulating film 2 on the surface of the inactive region of the p-type semiconductor substrate 1. As a result, because an effective channel length can be ensured between the source and drain regions and thereby, it is possible to raise the punch-through withstand voltage of a nonvolatile memory cell Q.

(3) In a semiconductor integrated circuit device comprising a nonvolatile memory cell Q in which a charge storage gate electrode G1 is formed on the surface of an active region of a p-type semiconductor substrate 1 through a first gate insulating film 3, a control gate electrode G2 is formed on the surface of the charge storage gate electrode G1 through a second gate insulating film 13, and source and drain regions are formed on the surface of the active region of the p-type semiconductor substrate 1 in self-alignment with the charge storage gate electrode G1, the fluctuation of thermal-oxidation insulating film grown from side wall, in the gate-length direction, of the charge storage gate electrode G1 toward the central portion of the charge storage gate electrode G1 between the charge storage gate electrode G1 and the p-type semiconductor substrate 1 is set to 5 nm or less. Because the fluctuation of the threshold voltage after programming can be controlled by the above structure, it is possible to increase the operational margin of the nonvolatile memory cell Q against the fluctuation of the power source potential.

In the step before forming the second gate material 11, it is also possible to use an amorphous silicon film (a-Si) with an impurity concentration of $1\times10^{19}$ atoms/cm$^3$ or lower for the first gate material 8. In this case, the same advantage is obtained as in the case where a polycrystalline silicon film with an impurity concentration of $1\times10^{19}$ atoms/cm$^3$ is used for the first gate material 8.

(Embodiment 4)

Figure 21:
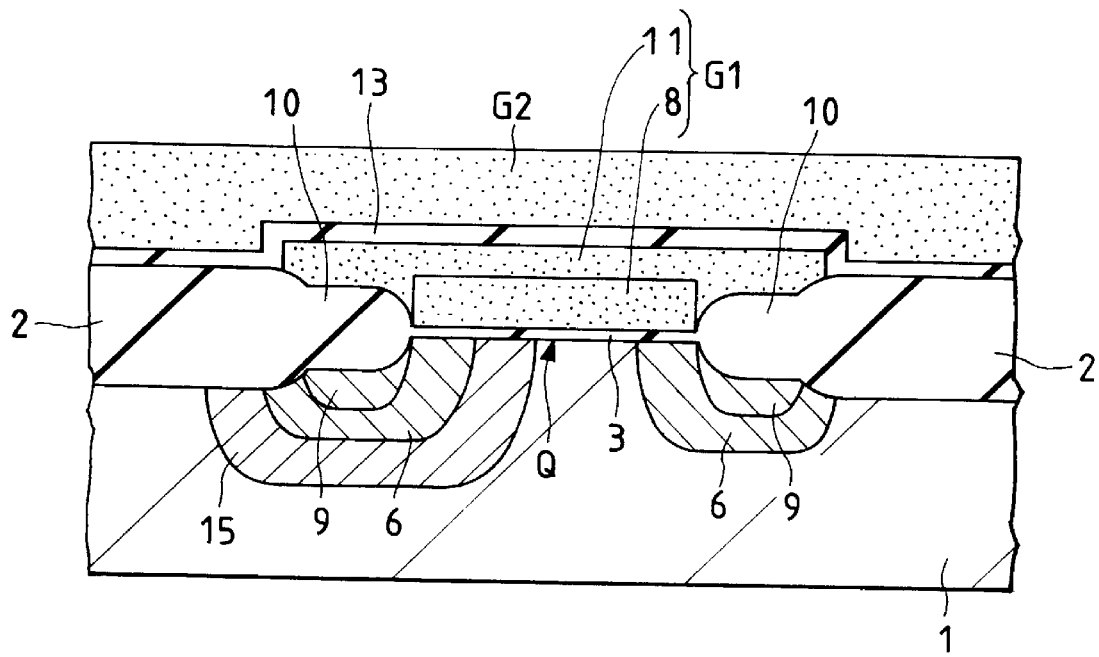
FIG. 21 is a sectional view of a principal part of the semiconductor integrated circuit device of embodiment 4 of the present invention.

A schematic structure of the semiconductor integrated circuit device of embodiment 4 of the present invention comprising a nonvolatile memory cell is shown in FIG. 21 (sectional view of a principal part).

As shown in FIG. 21, the semiconductor integrated circuit device has a nonvolatile memory cell Q which undergoes the programming and erasing operations by the tunnel effect. The nonvolatile memory cell Q mainly comprises a p-type semiconductor substrate 1 serving as a channel forming region, a first gate insulating film 3, a charge storage gate electrode G1, a second gate insulating film 13, a control gate electrode G2, a pair of n-type semiconductor regions 6 serving as a source region and a drain region respectively, a pair of n$^+$-type semiconductor regions 9 serving as a source region and a drain region respectively, and a p-type semiconductor region 15 serving as a threshold-voltage control region. The impurity concentration of the p-type semiconductor region 15 is set to, say, approx. $5\times10^{17}$ atoms/cm$^2$.

The p-type semiconductor region 15 is formed by selectively introducing p-type impurities into the surface of one of the p-type semiconductor substrate 1 between the field insulating film 2 and the oxidation-resistant mask 5 by, for example, an ion implantation method after the step of forming the first gate material 8 and before the step of forming a pair of n-type semiconductor regions 6 serving as a source region and a drain region respectively. The p-type impurities are introduced into the surface with an acceleration energy of 100 keV, and a dose of $1\times10^{14}$ atoms/cm$^2$ from a direction at an angle of 60° to the surface of the p-type semiconductor substrate 1.

Thus, by including the step of forming the p-type semiconductor region 15 after the step of forming the first gate material 8 and before the step of forming a pair of n-type semiconductor regions 6 serving as a source region and a drain region respectively, it is possible to set a punch-through withstand voltage to 7 V while keeping a threshold voltage measured from the control gate electrode G2 at 2 V even when the gate length of the charge storage gate electrode G1 is set to 0.4 µm.

(Embodiment 5)

Figure 22:
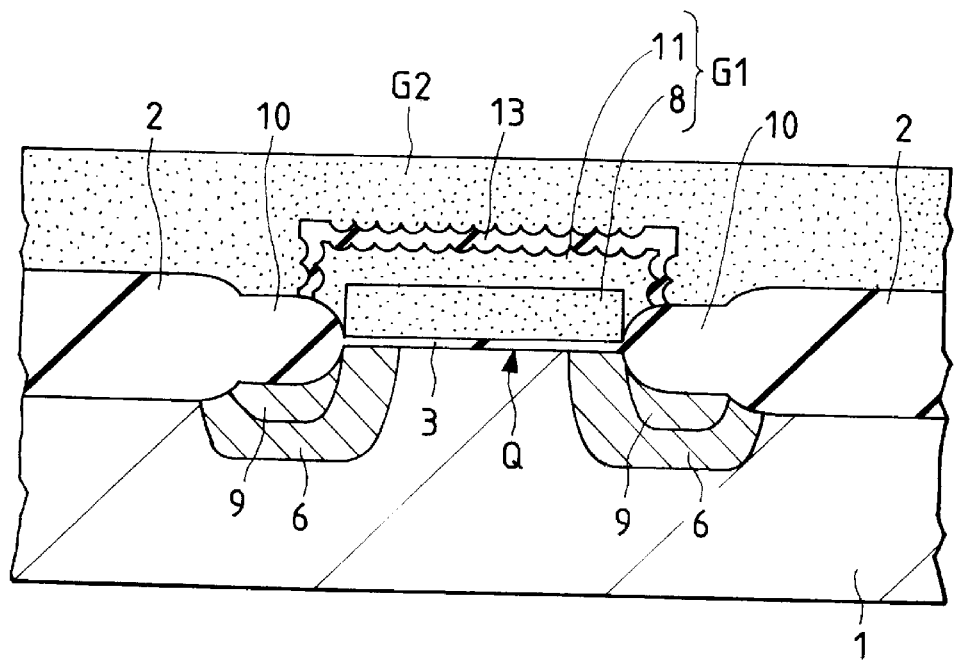
FIG. 22 is a sectional view of a principal part of the semiconductor integrated circuit device of embodiment 5 of the present invention.

A schematic structure of the semiconductor integrated circuit device of embodiment 5 of the present invention comprising a nonvolatile memory cell is shown in FIG. 22 (sectional view of a principal part).

As shown in FIG. 22, the semiconductor integrated circuit device has a nonvolatile memory cell Q for which programming and erasing operations are performed by the tunnel effect. The nonvolatile memory cell Q mainly comprises a p-type semiconductor substrate 1 serving as a channel forming region, a first gate insulating film 3, a charge storage gate electrode G1, a second gate insulating film 13, a control gate electrode G2, a pair of n-type semiconductor regions 6 serving as a source region and a drain region respectively, an n-type semiconductor region 6 serving as a drain region, and a pair of n$^+$-type semiconductor regions 9 serving as a source region and a drain region respectively.

The charge storage gate electrode G1, similarly to the previously-described embodiment 1, comprises a first gate material 8 and a second gate material 11 superimposed on the first gate material 8. The second gate material 11 is made of a polycrystalline silicon film containing phosphorus as impurities for decreasing a resistance value.

The surface of the second gate material 11 is irregular. The irregularity of the surface of the second gate material 11 is formed by dipping the p-type semiconductor substrate 1 in a phosphoric acid solution before the step of forming the second gate insulating film 13. The step of dipping the p-type semiconductor substrate 1 in the phosphoric acid solution is performed under the condition that the semiconductor substrate 1 is dipped in a phosphoric acid solution ($H_3PO_4$) at approx. 140° to 160° C. for approx. 60 min.

Therefore, because the surface of the second gate material 11 can be made irregular by using a polycrystalline silicon film containing phosphorus for the second gate material 11 and including the step of dipping the semiconductor substrate 1 in the phosphoric acid solution after the step of forming the second gate material 11 and before the step of forming the second gate insulating film 13, it is possible to increase the surface area of the charge storage gate electrode G1 and thereby, increase the storage amount of charges of a nonvolatile memory cell Q.

It is also possible to form the irregularity of the surface of the second gate material 11 by depositing hemispherical grains (HSG) by a CVD method.

Inventions made by the present inventor have been described above in detail in accordance with the embodiments. However, the present invention is not restricted to these embodiments. It is a matter of course that various modifications of the present invention are allowed as long as they are not deviated from the gist of the present invention.

The following is the brief description of advantages of a representative among the inventions disclosed in this application.

It is possible to uniform the programming and erasing operations of a nonvolatile memory cell mounted on a semiconductor integrated circuit device.

Moreover, it is possible to raise a punch-through withstand voltage of a nonvolatile memory cell mounted on the semiconductor integrated circuit device.

Furthermore, it is possible to increase the operational margin of a nonvolatile memory cell mounted on the semiconductor integrated circuit device.

What is claimed is:

1. A method of manufacturing a semiconductor integrated circuit device, comprising steps of:
   (a) providing (i) a semiconductor substrate having an active region and (ii) a first insulating film on the substrate, wherein said active region is defined by said first insulating film;
   (b) forming a first silicon film over said active region with a first gate insulating film intervening therebetween, said first silicon film having an impurity concentration of $1\times10^{19}$ atoms/cm$^3$ or lower and having a first length in a first direction over said active region, such that, in said first direction, parallel to a principal surface of the substrate, both edge portions of said first silicon film are formed over said active region;
   (c) after said step (b), performing thermal-oxidation to form thermal-oxidation insulating films on said active region such that said thermal-oxidation insulating films are formed, in said first direction, adjacent to said edge portions of said first silicon film, wherein said thermal-oxidation insulating films each have a film thickness thicker than that of said first gate insulating film and thinner than that of sid first insulating film;
   (d) after said step (c), forming a second silicon film on said first silicon film to contact said first silicon film, said second silicon film having an impurity concentration higher than that of said first silicon film; and
   (e) after said step (d), forming a conductive film over said second silicon film with a second gate insulating film intervening therebetween.

2. A method of manufacturing a semiconductor integrated circuit device according to claim 1,
   wherein an impurity included in said second silicon film is introduced into said first silicon film.

3. A method of manufacturing a semiconductor integrated circuit device according to claim 1, wherein said first silicon film is comprised of a polycrystalline silicon film in said step (b).

4. A method of manufacturing a semiconductor integrated circuit device according to claim 3, wherein said polycrystalline silicon film is a non-doped polycrystalline silicon film.

5. A method of manufacturing a semiconductor integrated circuit device according to claim 1, wherein said first silicon film is comprised of an amorphous silicon film in said step (b).

6. A method of manufacturing a semiconductor integrated circuit device according to claim 1,
   wherein said first silicon film and said second silicon film together serve as a floating gate electrode of a memory cell,
   wherein said conductive film serves as a control gate electrode of said memory cell, and
   wherein carriers stored in said first silicon film are transferred between said first silicon film and said substrate through said first gate insulating film by tunneling.

7. A method of manufacturing a semiconductor integrated circuit device, comprising steps of:
   (a) providing (i) a semiconductor substrate having an active region and (ii) a first insulating film on the substrate, wherein said active region is defined by said first insulating film;
   (b) forming a first silicon film over said active region with a first gate insulating film intervening therebetween, said first silicon film having an impurity concentration of $1\times10^{19}$ atoms/cm$^3$ or lower and having a first length in a first direction over said active region such that, in said first direction, parallel to a principal surface of the substrate, both edge portions of said first silicon film are formed over said active region;
   (c) after said step (b), forming side wall spacers on side surfaces of said first silicon film, said side wall spacers are each comprised of an insulating film;
   (d) after said step (c), performing thermal-oxidation to form thermal-oxidation insulating films on said active region in self-alignment with said side wall spacers, said thermal-oxidation insulating films each have a film thickness thicker than that of said first gate insulating film and thinner than that of said first insulating film;
   (e) after said step (d), forming a second silicon film on said first silicon film and said side wall spacers to contact said first silicon film and to have in said first direction a second length greater than said first length, said second silicon film having an impurity concentration higher than that of said first silicon film; and
   (f) forming a conductive film over said second silicon film with a second gate insulating film intervening therebetween.

8. A method of manufacturing a semiconductor integrated circuit device according to claim 7, wherein said side wall spacers are each comprised of a silicon oxide film.

9. A method of manufacturing a semiconductor integrated circuit device according to claim 7, wherein an impurity included in said second silicon film is introduced into said first silicon film.

10. A method of manufacturing a semiconductor integrated circuit device according to claim 7, wherein said first silicon film is comprised of a polycrystalline silicon film in said step (b).

11. A method of manufacturing a semiconductor integrated circuit device according to claim 10, wherein said polycrystalline silicon film is a non-doped polycrystalline silicon film.

12. A method of manufacturing a semiconductor integrated circuit device according to claim 7, wherein said first silicon film is comprised of an amorphous silicon film in said step (b).

13. A method of manufacturing a semiconductor integrated circuit device according to claim 7, wherein said first silicon film and said second silicon film together serve as a floating gate electrode of a memory cell, wherein said conductive film serves as a control gate electrode of said memory cell, and wherein carriers stored in said first silicon film are transferred between said first silicon film and said substrate through said first gate insulating film by tunneling.

14. A method of manufacturing a semiconductor integrated circuit device, comprising steps of:

(a) providing (i) a semiconductor substrate having an active region, and (ii) a first insulating film on the substrate, wherein said active region is defined by said first insulating film;

(b) forming a first silicon film with material of a second insulating film, said first silicon film being formed over said active region and with a first gate insulating film intervening therebetween, said first silicon film having an impurity concentration of $1 \times 10^{19}$ atoms/cm$^3$ or lower and having a first length in a first direction over said active region such that, in said first direction, parallel to a principal surface of the substrate, both edge portions of said first silicon film are formed over said active region, and said second insulating film being formed over said first silicon film;

(c) after said step (b), forming side wall spacers on side surfaces of both said first silicon film and said second insulating film, said side wall spacers are each comprised of an insulating film;

(d) after said step (c), performing thermal-oxidation to form thermal-oxidation insulating films on said active region in self-alignment with said side wall spacers, said thermal-oxidation insulating films each have a film thickness thicker than that of said first gate insulating film and thinner than that of said first insulating film;

(e) after said step (d), removing said second insulating film, (f) after said step (e), forming a second silicon film on said first silicon film and said side wall spacers to contact said first silicon film and to extend in said first direction over said side wall spacers, said second silicon film having an impurity concentration higher than that of said first silicon film; and (g) forming a conductive film over said second silicon film with a second gate insulating film intervening therebetween, wherein said first silicon film and said second silicon film together serve as a floating gate electrode of a memory cell, and wherein said conductive film serves as a control gate electrode of said memory cell.

15. A method of manufacturing a semiconductor integrated circuit device according to claim 14, wherein said second insulating film is comprised of a silicon nitride film, and wherein said side wall spacers are each comprised of a silicon oxide film.

16. A method of manufacturing a semiconductor integrated circuit device according to claim 14, wherein carriers stored in said first silicon film are transferred between said first silicon film and said substrate through said first gate insulating film by tunneling.

17. A method of manufacturing a semiconductor integrated circuit device according to claim 1, wherein said second silicon film is formed by depositing hemispherical grains by a CVD method.

18. A method of manufacturing a semiconductor integrated circuit device according to claim 7, wherein said second silicon film is formed by depositing hemispherical grains by a CVD method.

19. A method of manufacturing a semiconductor integrated circuit device according to claim 14, wherein said second silicon film is formed by depositing hemispherical grains by a CVD method.

* * * * *